US011029466B2

(12) United States Patent
Charles et al.

(10) Patent No.: US 11,029,466 B2
(45) Date of Patent: Jun. 8, 2021

(54) PHOTONICS STRUCTURE WITH INTEGRATED LASER

(71) Applicants: The Research Foundation for The State University of New York, Albany, NY (US); The Regents of The University of California, Oakland, CA (US)

(72) Inventors: William Charles, Albany, NY (US); John Bowers, Santa Barbara, CA (US); Douglas Coolbaugh, Albany, NY (US); Daehwan Jung, Santa Barbara, CA (US); Jonathan Klamkin, Santa Barbara, CA (US); Douglas La Tulipe, Albany, NY (US); Gerald L. Leake, Jr., Albany, NY (US); Songtao Liu, Santa Barbara, CA (US); Justin Norman, Santa Barbara, CA (US)

(73) Assignees: The Research Foundation for the State University of New York, Albany, NY (US); The Regents of the University of California, Oakland, CA (US)

( * ) Notice: Subject to any disclaimer, the term of this patent is extended or adjusted under 35 U.S.C. 154(b) by 0 days.

(21) Appl. No.: 16/575,820

(22) Filed: Sep. 19, 2019

(65) Prior Publication Data
US 2020/0166703 A1 May 28, 2020

Related U.S. Application Data

(60) Provisional application No. 62/770,623, filed on Nov. 21, 2018.

(51) Int. Cl.
*G02B 6/12* (2006.01)
*G02B 6/13* (2006.01)
*G02B 6/132* (2006.01)

(52) U.S. Cl.
CPC ......... *G02B 6/12007* (2013.01); *G02B 6/131* (2013.01); *G02B 6/132* (2013.01);
(Continued)

(58) Field of Classification Search
CPC ...................................................... G02B 6/132
See application file for complete search history.

(56) References Cited

U.S. PATENT DOCUMENTS

| 6,048,775 A | 4/2000 | Yao et al. |
| 6,056,630 A | 5/2000 | Nanda et al. |

(Continued)

FOREIGN PATENT DOCUMENTS

| EP | 2 214 042 A1 | 8/2010 |
| GB | 2 552 264 A | 1/2018 |
| WO | WO 2018/098146 A1 | 5/2018 |

OTHER PUBLICATIONS

Stintz, A. et al., "Low-Threshold Current Density 1.3-μm InAs Quantum-Dot Lasers with the Dots-in-a-Well (DWELL) Structure," IEEE Photonics Technology Letters, vol. 12, No. 6, Jun. 2000, pp. 591-593.

(Continued)

*Primary Examiner* — Sung H Pak
(74) *Attorney, Agent, or Firm* — George S. Blasiak, Esq.; Heslin Rothenberg Farley & Mesiti P.C.

(57) ABSTRACT

There is set forth herein a method including a substrate; a dielectric stack disposed on the substrate; one or more photonics device integrated in the dielectric stack; and a laser light source having a laser stack including a plurality of structures arranged in a stack, wherein structures of the plurality of structures are integrated in the dielectric stack, wherein the laser stack includes an active region configured to emit light in response to the application of electrical energy to the laser stack.

28 Claims, 18 Drawing Sheets

(52) U.S. Cl.
CPC .............. *G02B 2006/12061* (2013.01); *G02B 2006/12121* (2013.01)

(56) References Cited

U.S. PATENT DOCUMENTS

| | | | |
|---|---|---|---|
| 6,108,464 | A | 8/2000 | Foresi et al. |
| 6,621,972 | B2 | 9/2003 | Kimerling et al. |
| 6,631,225 | B2 | 10/2003 | Lee et al. |
| 6,635,110 | B1 | 10/2003 | Luan et al. |
| 6,690,871 | B2 | 2/2004 | Lee et al. |
| 6,706,576 | B1 | 3/2004 | Ngo |
| 6,812,495 | B2 | 11/2004 | Wada et al. |
| 6,879,014 | B2 | 4/2005 | Wagner et al. |
| 6,887,773 | B2 | 5/2005 | Gunn, III et al. |
| 6,927,392 | B2 | 8/2005 | Liddiard |
| 7,008,813 | B1 | 3/2006 | Lee et al. |
| 7,095,010 | B2 | 8/2006 | Scherer et al. |
| 7,103,245 | B2 | 9/2006 | Lee et al. |
| 7,123,805 | B2 | 10/2006 | Sparacin et al. |
| 7,190,871 | B2 | 3/2007 | Lock et al. |
| 7,194,166 | B1 | 3/2007 | Gunn, III et al. |
| 7,205,525 | B2 | 4/2007 | Yasaitis |
| 7,259,031 | B1 | 8/2007 | Dickinson et al. |
| 7,262,117 | B1 | 8/2007 | Gunn, III et al. |
| 7,279,682 | B2 | 10/2007 | Ouvrier-Buffet et al. |
| 7,317,242 | B2 | 1/2008 | Takizawa |
| 7,321,713 | B2 | 1/2008 | Akiyama et al. |
| 7,389,029 | B2 | 6/2008 | Rahman et al. |
| 7,397,101 | B1 | 7/2008 | Masini et al. |
| 7,424,181 | B2 | 9/2008 | Haus et al. |
| 7,459,686 | B2 | 12/2008 | Syllaios et al. |
| 7,480,430 | B2 | 1/2009 | Saini et al. |
| 7,565,046 | B2 | 7/2009 | Feng et al. |
| 7,613,369 | B2 | 11/2009 | Witzens et al. |
| 7,651,880 | B2 | 1/2010 | Tweet et al. |
| 7,659,627 | B2 | 2/2010 | Miyachi et al. |
| 7,700,975 | B2 | 4/2010 | Rakshit et al. |
| 7,723,206 | B2 | 5/2010 | Miyachi et al. |
| 7,723,754 | B2 | 5/2010 | Wada et al. |
| 7,737,534 | B2 | 6/2010 | McLaughlin et al. |
| 7,801,406 | B2 | 9/2010 | Pan et al. |
| 7,816,767 | B2 | 10/2010 | Pei et al. |
| 7,831,123 | B2 | 11/2010 | Sparacin et al. |
| 7,902,620 | B2 | 3/2011 | Assefa et al. |
| 7,906,825 | B2 | 3/2011 | Tweet et al. |
| 7,916,377 | B2 | 3/2011 | Witzens et al. |
| 7,943,471 | B1 | 5/2011 | Bauer et al. |
| 7,994,066 | B1 | 8/2011 | Capellini et al. |
| 8,030,668 | B2 | 10/2011 | Hisamoto et al. |
| 8,227,787 | B2 | 7/2012 | Kumar et al. |
| 8,354,282 | B2 | 1/2013 | Stern |
| 8,471,639 | B2 | 6/2013 | Welch |
| 8,592,745 | B2 | 11/2013 | Masini et al. |
| 8,625,935 | B2 | 1/2014 | Mekis et al. |
| 8,633,067 | B2 | 1/2014 | Assefa et al. |
| 8,649,639 | B2 | 2/2014 | Mekis et al. |
| 8,664,739 | B2 | 3/2014 | King et al. |
| 8,742,398 | B2 | 6/2014 | Klem et al. |
| 8,754,711 | B2 | 6/2014 | Welch |
| 8,787,774 | B2 | 7/2014 | Guckenberger |
| 8,798,476 | B2 | 8/2014 | Gloeckner et al. |
| 8,877,616 | B2 | 11/2014 | Pinguet et al. |
| 8,895,413 | B2 | 11/2014 | Pinguet et al. |
| 9,046,650 | B2 | 6/2015 | Lin et al. |
| 9,091,827 | B2 | 7/2015 | Verslegers et al. |
| 9,110,221 | B2 | 8/2015 | Agarwal et al. |
| 9,864,138 | B2 | 1/2018 | Coolbaugh |
| 10,295,745 | B2 | 5/2019 | Coolbaugh |
| 2002/0052120 | A1 | 5/2002 | Shintani et al. |
| 2002/0172487 | A1 | 11/2002 | Hwang et al. |
| 2003/0063836 | A1 | 4/2003 | Lam et al. |
| 2003/0137706 | A1 | 7/2003 | Rmanujam et al. |
| 2003/0215203 | A1 | 11/2003 | Lock et al. |
| 2004/0057684 | A1 | 3/2004 | Kokubun |
| 2005/0012040 | A1 | 1/2005 | Fiorini et al. |
| 2005/0051705 | A1 | 3/2005 | Yasaitis |
| 2005/0101084 | A1 | 5/2005 | Gilton |
| 2005/0111806 | A1 | 5/2005 | Brask |
| 2005/0205954 | A1 | 9/2005 | King et al. |
| 2005/0220984 | A1 | 10/2005 | Sun et al. |
| 2006/0110844 | A1 | 5/2006 | Lee et al. |
| 2006/0194357 | A1 | 8/2006 | Hsu et al. |
| 2006/0243973 | A1 | 11/2006 | Gilton |
| 2006/0249753 | A1 | 11/2006 | Herner |
| 2006/0250836 | A1 | 11/2006 | Herner et al. |
| 2006/0250837 | A1 | 11/2006 | Herner |
| 2006/0289764 | A1 | 12/2006 | Fiorini et al. |
| 2007/0034978 | A1 | 2/2007 | Pralle et al. |
| 2007/0099329 | A1 | 5/2007 | Maa et al. |
| 2007/0104411 | A1 | 5/2007 | Ahn et al. |
| 2007/0141744 | A1 | 6/2007 | Lee et al. |
| 2007/0170536 | A1 | 7/2007 | Hsu et al. |
| 2007/0190722 | A1 | 8/2007 | Herner |
| 2007/0228414 | A1 | 10/2007 | Kumar et al. |
| 2007/0262296 | A1 | 11/2007 | Bauer |
| 2008/0121805 | A1 | 5/2008 | Tweet et al. |
| 2008/0157253 | A1 | 7/2008 | Starikov et al. |
| 2008/0217651 | A1 | 9/2008 | Liu et al. |
| 2008/0311696 | A1 | 12/2008 | Chee-Wee et al. |
| 2008/0311718 | A1 | 12/2008 | Futase |
| 2008/0316795 | A1 | 12/2008 | Herner |
| 2008/0318397 | A1 | 12/2008 | Herner |
| 2009/0032814 | A1 | 2/2009 | Vashchenko et al. |
| 2009/0196631 | A1 | 8/2009 | Daghighian et al. |
| 2010/0006784 | A1 | 1/2010 | Mack et al. |
| 2010/0006961 | A1 | 1/2010 | Yasaitis et al. |
| 2010/0008675 | A1 | 1/2010 | De Dobbelaere |
| 2010/0029033 | A1 | 2/2010 | Carothers et al. |
| 2010/0046955 | A1 | 2/2010 | De Dobbelaere et al. |
| 2010/0060972 | A1 | 3/2010 | Kucharski et al. |
| 2010/0090110 | A1 | 4/2010 | Tweet et al. |
| 2010/0102412 | A1 | 4/2010 | Suh et al. |
| 2010/0133536 | A1 | 6/2010 | Syllaios et al. |
| 2010/0133585 | A1 | 6/2010 | Kim et al. |
| 2010/0151619 | A1 | 6/2010 | Yasaitis |
| 2010/0213561 | A1 | 8/2010 | Assefa et al. |
| 2010/0225791 | A1 | 9/2010 | Nakayama |
| 2011/0008060 | A1 | 1/2011 | Kucharski |
| 2011/0012221 | A1 | 1/2011 | Fukikata et al. |
| 2011/0027950 | A1 | 2/2011 | Jones et al. |
| 2011/0063024 | A1 | 3/2011 | Kucharski et al. |
| 2011/0156183 | A1 | 6/2011 | Liu |
| 2011/0227116 | A1 | 9/2011 | Saito et al. |
| 2011/0236029 | A1 | 9/2011 | De Dobbelaere et al. |
| 2011/0243569 | A1 | 10/2011 | De Dobbelaere et al. |
| 2012/0001283 | A1 | 1/2012 | Assefa et al. |
| 2012/0025212 | A1 | 2/2012 | Kouvetakis et al. |
| 2012/0115310 | A1 | 5/2012 | Miu |
| 2012/0129302 | A1 | 5/2012 | Assefa et al. |
| 2012/0177378 | A1 | 7/2012 | De Dobbelaere et al. |
| 2012/0187280 | A1 | 7/2012 | Kerness et al. |
| 2012/0193636 | A1 | 8/2012 | Stern |
| 2012/0205524 | A1 | 8/2012 | Mack et al. |
| 2012/0252158 | A1 | 10/2012 | Carothers et al. |
| 2012/0288971 | A1 | 11/2012 | Boagaerts et al. |
| 2012/0288992 | A1 | 11/2012 | Assefa et al. |
| 2013/0154042 | A1 | 6/2013 | Meade |
| 2013/0202005 | A1 | 8/2013 | Dutt |
| 2013/0214160 | A1 | 8/2013 | Cazaux et al. |
| 2013/0228886 | A1 | 9/2013 | JangJian et al. |
| 2013/0284889 | A1 | 10/2013 | Giffard et al. |
| 2013/0313579 | A1 | 11/2013 | Kouvetakis et al. |
| 2013/0328145 | A1 | 12/2013 | Liu et al. |
| 2013/0336664 | A1 | 12/2013 | Mack et al. |
| 2014/0008750 | A1 | 1/2014 | Feshali et al. |
| 2014/0029892 | A1 | 1/2014 | Pomerene et al. |
| 2014/0124669 | A1 | 5/2014 | Zheng et al. |
| 2014/0131733 | A1 | 5/2014 | Meade |
| 2014/0159129 | A1 | 6/2014 | Wang et al. |
| 2014/0175510 | A1 | 6/2014 | Suh et al. |
| 2014/0203325 | A1 | 7/2014 | Verma et al. |
| 2014/0206190 | A1 | 7/2014 | Li et al. |
| 2015/0177458 | A1 | 6/2015 | Bowers et al. |
| 2016/0197111 | A1 | 7/2016 | Coolbaugh et al. |

(56) References Cited

U.S. PATENT DOCUMENTS

| | | | |
|---|---|---|---|
| 2016/0223749 | A1 | 8/2016 | Coolbaugh |
| 2016/0363729 | A1 | 12/2016 | Baiocco et al. |
| 2017/0299809 | A1 | 10/2017 | Boeuf et al. |
| 2018/0143374 | A1 | 5/2018 | Coolbaugh et al. |
| 2018/0314003 | A1 | 11/2018 | Coolbaugh et al. |
| 2019/0025513 | A1 | 1/2019 | Coolbaugh et al. |
| 2019/0101711 | A1* | 4/2019 | Van Campenhout .... G02B 6/13 |
| 2019/0129097 | A1* | 5/2019 | Liu ........................ G02B 6/136 |
| 2019/0310417 | A1 | 10/2019 | Coolbaugh et al. |
| 2019/0331941 | A1 | 10/2019 | Coolbaugh et al. |
| 2020/0026003 | A1 | 1/2020 | Coolbaugh et al. |
| 2020/0166703 | A1 | 5/2020 | Charles et al. |
| 2020/0166720 | A1 | 5/2020 | Charles et al. |

OTHER PUBLICATIONS

Ray, S.K. et al., "Improved Temperature Performance of 1.31-μm Quantum Dot Lasers by Optimized Ridge Waveguide Design," IEEE Photonics Technology Letters, vol. 17, No. 9, Sep. 2005, pp. 1785-1787 (+cover).

Crowley, M.T. et al., "GaAs-Based Quantum Dot Lasers," Semiconductors and Semimetals, vol. 86, ISSN: 0080-8784, 2012, pp. 371-417.

Liu, G.T. et al., "Ultra-low threshold current density quantum dot lasers using the dots-in-a-well (DWELL) structure," Physics and Simulation of Optoelectronic Devices VIII, vol. 3944, 2000, pp. 814-824.

Chen, S.M. et al., "1.3 μm InAs/GaAs quantum-dot laser monolithically grown on Si substrates operating over 100° C.," Electronics Letters, vol. 50 No. 20, Sep. 25, 2014, pp. 1467-1468.

Kwoen, J. et al., "All MBE grown InAs/GaAs quantum dot lasers on on-axis Si (001)," Optics Express, vol. 26, No. 9, Apr. 30, 2018, pp. 11568-11576.

Park, C.Y. et al., "Electroluminescence at 1.3 μm from InAs/GaAs quantum dots monolithically grown on Ge/Si substrate by metal organic chemical vapor deposition," IOPScience, The Japan Society of Applied Physics, 2016, pp. 100304-1 thru 100304-4 (+Cover).

Wnag, J. et al., "1.3 μm InAs/GaAs quantum dot lasers on silicon with GaInP upper cladding layers," Photonics Research, vol. 6, No. 4, Apr. 2018, pp. 321-325.

Lee A.D. et al., "InAs/GaAs Quantum-Dot Lasers Monolithically Grown on Si, Ge, and Ge-on-Si Substrates," IEEE Journal of Selected Topics in Quantum Electronics, vol. 19, No. 4, Jul./Aug. 2013, 7 pages.

Wan, Y. et al., "InAs/GaAs quantum dots on GaAs-on-V-grooved-Si substrate with high optical quality in the 1.3 μm band," Applied Physics Letters, 2015, 081106-1 thru 081106-4 (+cover).

Chen, S. et al., "Electrically pumped continuous-wave III-V guantum dot lasers on silicon," Nature Photonics, 2016, pp. 1-6.

Tang, M. et al., "Optimizations of Defect Filter Layers for 1.3 μm InAs/GaAs Quantum-Dot Lasers Monolithically Grown on Si Substrates," IEEE Journal of Selected Topics in Quantum Electronics, vol. 22, No. 6, Nov./Dec. 2016, 7 pages.

Liu, G.T. et al, "The Influence of Quantum-Well Composition on the Performance of Quantum Dot Lasers Using InAs/InGaAs Dots-in-a-Well (DWELL) Structures," IEEE Journal of Quantum Electronics, vol. 36, No. 11, Nov. 2000, pp. 1272-1279.

Written Opinion, International Application No. PCT/US2019/052232, filed Sep. 20, 2019, dated May 11, 2020.

Search Report, International Application No. PCT/US2019/052232, filed Sep. 20, 2019, dated May 11, 2020.

Written Opinion, International Application No. PCT/US2019/052234, filed Sep. 20, 2019, dated Apr. 20, 2020.

Search Report, International Application No. PCT/US2019/052234, filed Sep. 20, 2019, dated Apr. 20, 2020.

* cited by examiner

PHOTONICS STRUCTURE WITH INTEGRATED LASER

CROSS-REFERENCE TO RELATED APPLICATION

This application claims the benefit of priority of U.S. Provisional Application No. 62/770,623 filed Nov. 21, 2018, titled "PHOTONICS STRUCTURE WITH INTEGRATED LASER", which is incorporated by reference herein in its entirety.

GOVERNMENT RIGHTS STATEMENT

This invention was made with government support under grant contract number FA8650-15-2-5220 ARPA-E, DE-AR0000672, and DARPA DODOS HR0011-15-C-0055. The government may have certain rights in the invention.

FIELD

The present disclosure relates to photonics generally and specifically to fabricating of photonics structures.

BACKGROUND

Commercially available photonics integrated circuits are fabricated on wafers, such as bulk silicon or silicon-on-insulator wafers.

In one aspect photonics integrated circuits can include waveguides for transmission of optical signals between different areas of a photonics integrated circuit chip as well as on and off the chip. Commercially available waveguides are of rectangular or ridge geometry and are fabricated in silicon (single or polycrystalline) or silicon nitride.

Commercially available photonics integrated circuits can include photodetectors and other optical components. Photonics integrated circuits rely on the emission, modulation and the detection of light in the communication band (about 1.3 µm to about 1.55 µm). A bandgap absorption edge in germanium is near 1.58 µm. Germanium has been observed to provide sufficient photo-response for optoelectronic applications using 1.3 µm and 1.55 µm carrier wavelengths.

Commercially available photonics integrated circuit chips are available on systems having a photonics integrated circuit chip disposed on a printed circuit board.

BRIEF DESCRIPTION

The shortcomings of the prior art are overcome, and additional advantages are provided, through the provision, in one aspect, of a photonics structure.

There is set forth herein a structure including: a substrate; a dielectric stack disposed on the substrate; one or more photonics device integrated in the dielectric stack; and a laser light source having a laser stack including a plurality of structures arranged in a stack, wherein structures of the plurality of structures are integrated in the dielectric stack, wherein the laser stack includes an active region configured to emit light in response to the application of electrical energy to the laser stack.

There is set forth herein a method including: patterning a waveguide in a silicon layer of a silicon on insulator (SOI) wafer of a photonics structure having a dielectric stack defined by an insulator of the SOI wafer; forming in the photonics structure a trench extending through dielectric layers of the dielectric stack; and epitaxially growing a laser stack within the trench, the laser stack including a plurality of structures arranged in a stack, wherein structures of the plurality of structures are disposed within the dielectric stack and include an active region configured to emit light in response to the application of electrical energy to the laser stack.

Additional features and advantages are realized through the techniques of the present disclosure.

BRIEF DESCRIPTION OF THE SEVERAL VIEWS OF THE DRAWINGS

One or more aspects of the present disclosure are particularly pointed out and distinctly claimed as examples in the claims at the conclusion of the specification. The foregoing and other objects, features, and advantages of the disclosure are apparent from the following detailed description taken in conjunction with the accompanying drawings in which:

DETAILED DESCRIPTION

Aspects of the present disclosure and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the disclosure in detail. It should be understood, however, that the detailed description and the specific examples, while indicating aspects of the disclosure, are given by way of illustration only, and not by way of limitation. Various substitutions, modifications, additions, and/or arrangements, within the spirit and/or scope of the underlying inventive concepts will be apparent to those skilled in the art from this disclosure.

Figure 1:
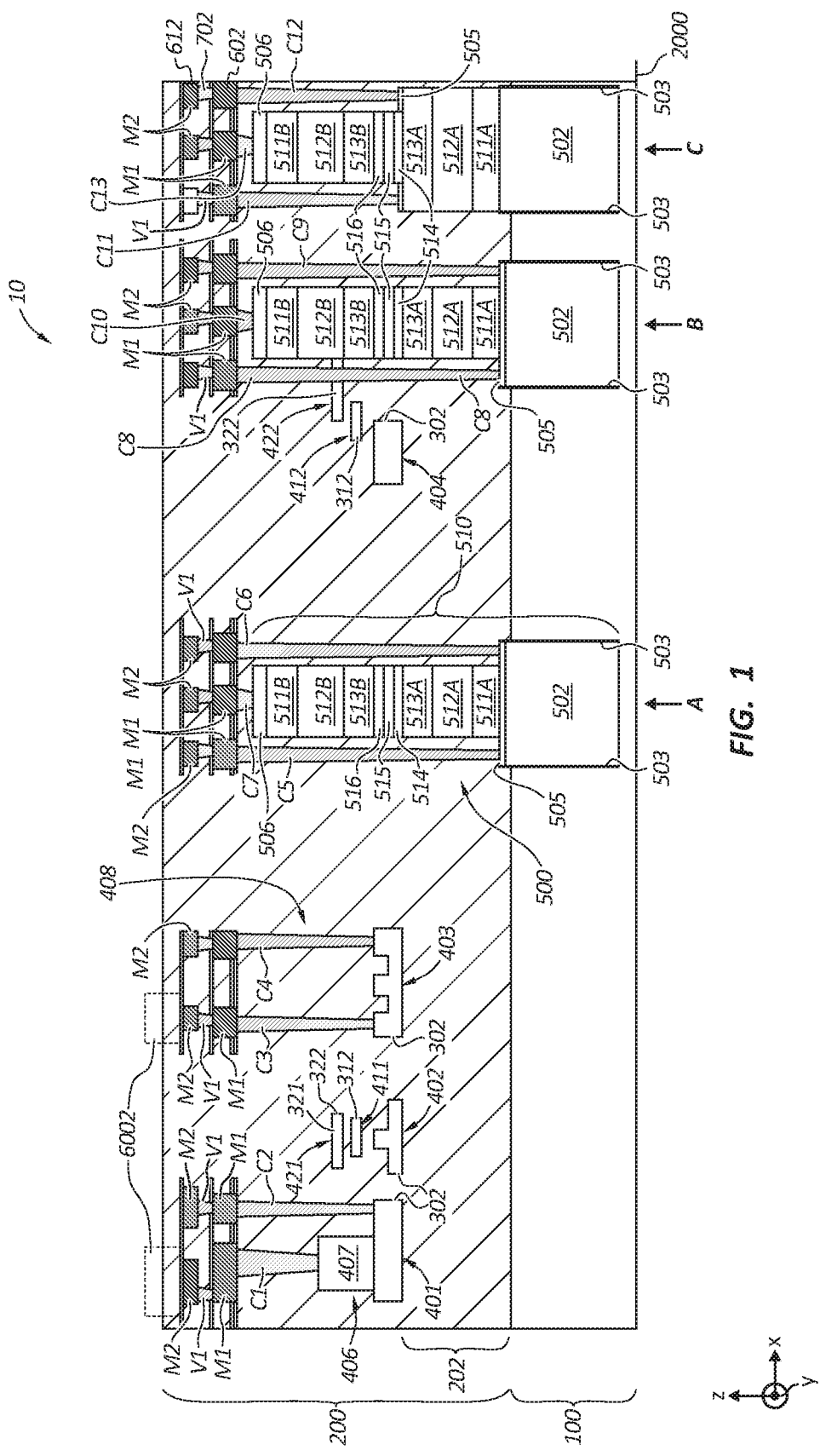
FIG. 1 is a cutaway side view of an optoelectronics system.

FIG. 1 illustrates photonics structure 10 having a photonics dielectric stack 200, in which there can be integrally formed and fabricated one or more photonics device, such as one or more photonics device integrally formed and fabricated within photonics dielectric stack 200, and one or more laser light source having a laser stack integrally formed and fabricated within dielectric stack 200.

One or more photonics device integrally formed and fabricated within dielectric stack 200 can include, e.g. waveguide 402 provided by a silicon (Si) ridge waveguide and can include waveguide 404 provided by a silicon rectangular waveguide. Waveguide 411 provided by a rectangular silicon nitride waveguide, waveguide 412 provided by a rectangular silicon nitride waveguide, waveguide 421 provided by a rectangular silicon waveguide, and waveguide 422 provided by a rectangular silicon nitride waveguide.

Photonics structure 10 can have integrated therein other types of waveguides integrally formed and fabricated within dielectric stack 200. Photonics structure 10 can include integrally formed and fabricated within dielectric stack 200, e.g. a photodetector 406 having waveguiding material formation 401, light sensitive material formation 407, upper contact C1, and lower contact C2.

Photonics structure 10 can include integrally formed and fabricated within dielectric stack 200, modulator 408 having waveguiding material formation 403, contact C3, and contact C4. Photonics structure 10 can include integrally formed and fabricated within dielectric stack 200 other types of photonics devices, e.g. one or more grating, one or more polarizer, and/or one or more resonator. In the described embodiment set forth in reference to FIG. 1, waveguides integrally formed and fabricated within dielectric stack 200 can be, e.g. single crystalline silicon waveguides or waveguides formed of nitride, e.g. SiN, polycrystalline silicon waveguides, amorphous silicon waveguides, and/or silicon nitride or silicon oxynitride waveguides.

According to one embodiment, photonics structure 10 can be fabricated using silicon on insulator (SOI) wafer. Referring to FIG. 1, substrate 100 can be a substrate of an SOI wafer, layer 202 can be an insulator layer of an SOI wafer, and layer 302 can be a silicon layer of an SOI wafer. Layer 302 can have patterned therein waveguiding formation 401, ridge waveguide 402, waveguiding material formation 403 (defining modulator 408), and waveguide 404. Substrate 100 can have a bottom elevation at elevation 2000. Substrate 100 according to one embodiment can have a thickness in a range of from about 10 um to about 1000 um. Substrate 100 according to one embodiment can have a thickness in a range of from about 100 um to about 1000 um. Layer 202 according to one embodiment can have a thickness of from about 100 nm to about 10 um. Layer 202 according to one embodiment can have a thickness of from about 1 um to about 5 um. Layer 302 according to one embodiment can have a thickness of from about 10 nm to about 1000 nm. Layer 302 according to one embodiment can be formed of monocrystalline silicon.

Photonics structure 10 can have integrally formed and fabricated therein integrated laser light sources 500. Each integrated laser light source can include a laser stack 510 defined by buffer material formation 502, contact layer 505, aluminum tuning layer 511A, cladding layer 512A, aluminum tuning layer 513A, spacer layer 514, active region 515, patterned layer 516, aluminum tuning layer 513B, cladding layer 512B, aluminum tuning layer 511B, and contact layer 506. According to one embodiment, each successive layer of laser stack 510 can be deposited on a preceding layer. The depositing of each layer on a preceding layer can be performed by epitaxially growing the layer on a preceding layer.

Each integrated laser light source 500 can also include a dielectric liner 503 defined by a layer, one or more lower contacts (C5 and C6) for the integrated at location A, C8 and C9 for the integrated laser light source 500 at location B, and C11 an C12 for the integrated laser light source 500 at location C. Each integrated laser light source 500 can include an upper contact (C7 for integrated laser light source 500 at location A, C10 for integrated laser light source 500 at location B, and C13 for integrated laser light source 500 at location C).

Photonics structure 10 can further have formed and fabricated therein one or more metallization layer and one or more vias layer. Integrated photonics structure 10 as shown in FIG. 1 can include metallization layer 602 that can be patterned to define metallization formations M1, vias layer 702 can be patterned to define vias V1, and metallization layer 612 can be patterned to define metallization layer formations M2. Metallization layers 602 and 612 can define horizontally extending wires. Wires defined by metallization layers 602 and 612 can be horizontally extending through areas of photonics dielectric stack 200.

Horizontally extending wires defined by metallization layer 602 can be electrically connected to one or more vertically extending contact conductive material formations C1-C12 and vias V1 defined by vias layer 702 for distribution of one or more of control logic and/or power signals vertically and horizontally to different areas of photonics dielectric stack 200. Horizontally extending wires defined by metallization layer 612 can be electrically connected to one or more of vertically extending vias V1 defined by vias layer 702 for distribution of one or more electrical control logic and/or power signals vertically and horizontally between different areas of photonics dielectric stack 200.

Photonics structure 10 can include one or more photonics devices, e.g. one or more waveguides in the foreground and/or background (extending out of and/or into the paper of the drawing representation of FIG. 1) of laser light sources 500 can be aligned with respective active regions 515 of integrated laser light sources 500 at locations A, B, and C, as described further in connection with FIGS. 5A-5E herein. Photonics structure 10 can include, e.g. tens, hundreds, or thousands of photonics devices and/or integrated laser light sources 500 of which representative photonics devices and integrated laser light sources 500 are described in reference to FIG. 1.

Photonics structure 10 as shown in FIG. 1 according to one embodiment can refer to a wafer based photonics structure, prior to dicing to define integrated circuit chips. Photonics structure 10 according to one embodiment refers to an entire wafer based structure.

Photonics structure 10 as shown in FIG. 1 according to one embodiment can refer to a photonics integrated circuit chip formed by fabrication processing that includes dicing of a photonics wafer based structure. Photonics structure 10 according to one embodiment can refer to photonics structure integrated circuit chip defined by dicing of an entire wafer based structure.

Providing photonics structure 10 so that active region 515 of an integrated laser light source 500 is integrally formed and fabricated within dielectric stack 200 along with a waveguide into which the active region 515 emits light can facilitate precision alignment of an active region of an integrated laser light source 500 and a waveguide. Active regions 515 can emit light into such aligned waveguides in the foreground and/or in the background of integrated laser light sources 500. Integrally fabricating photonics devices and laser light sources on a common photonics structure, so that a photonics device in an active region of an integrated laser light source are commonly fabricated and disposed within a common dielectric stack facilitates precision alignment between such photonics device and integrated laser light source 500 and alleviates a need for packaging technologies for facilitation of alignment.

Photonics structure 10 can include one or more termination 6002 formed on metallization layer 612. Termination 6002 can include, e.g., one or more of (a) an opening formed in dielectric stack 200 opening to metallization layer 612; (b) a pad formed on metallization layer 612 and an opening to the pad; (c) an under bump metallization (UBM) layer formed on the metallization layer 612 with an opening formed in dielectric stack 200 to the UBM; (d) a UBM formed on metallization layer 612 and a solder bump formed on the UBM externally protruding from dielectric stack 200.

Figure 2A:
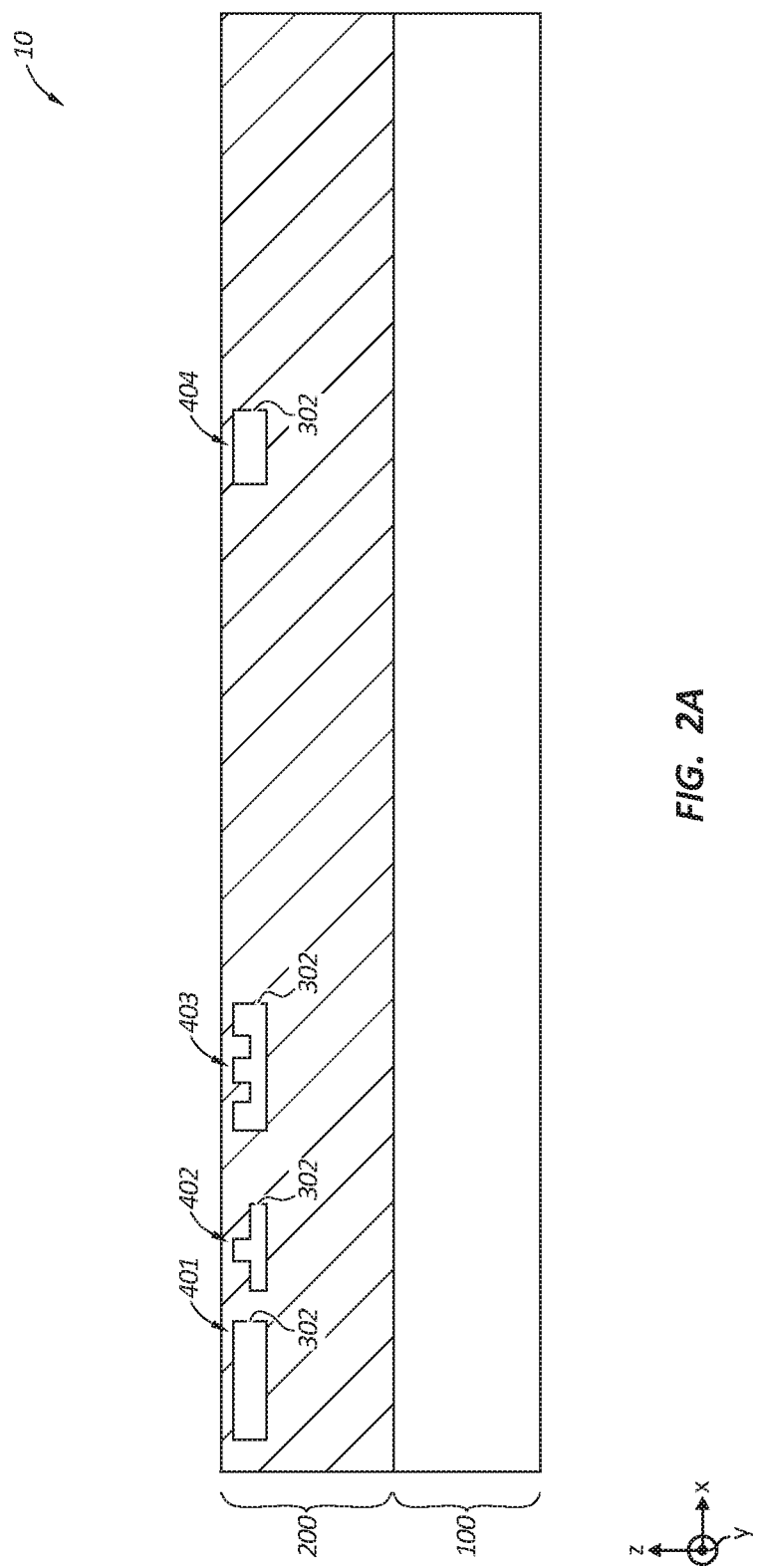
FIGS. 2A-2I are fabrication stage views illustrating a method for fabrication of the optoelectronics system as shown in FIG. 1 according to one embodiment.

A method for fabrication of photonics structure 10 is described with reference to the fabrication stage views of FIGS. 2A-2J. In FIG. 2A there is illustrated an intermediary stage view of photonics structure 10. Photonics structure 10 according to one embodiment can be fabricated using a SOI wafer having a substrate 100 formed of silicon (Si), insulator layer 202, and silicon layer 302. Within layer 302 there can be patterned waveguiding material formation 401 defining photodetector 406, waveguide 402 provided by a ridge waveguide, waveguiding material formation 403 defining a modulator, and waveguide 404 provided by a rectangular waveguide. On the patterning of formations 401-404 a layer of dielectric material, e.g. $SiO_2$ can be deposited over the formations 401-404 and can be subject to chemical mechanical planarization (CMP) so that a horizontal plane is defined at elevation 2020. In each instance herein where there is described CMP, the CMP can be accompanied by chemical mechanical polishing so that an atomically smooth surface is yielded as a result of the performing CMP.

Figure 2B:
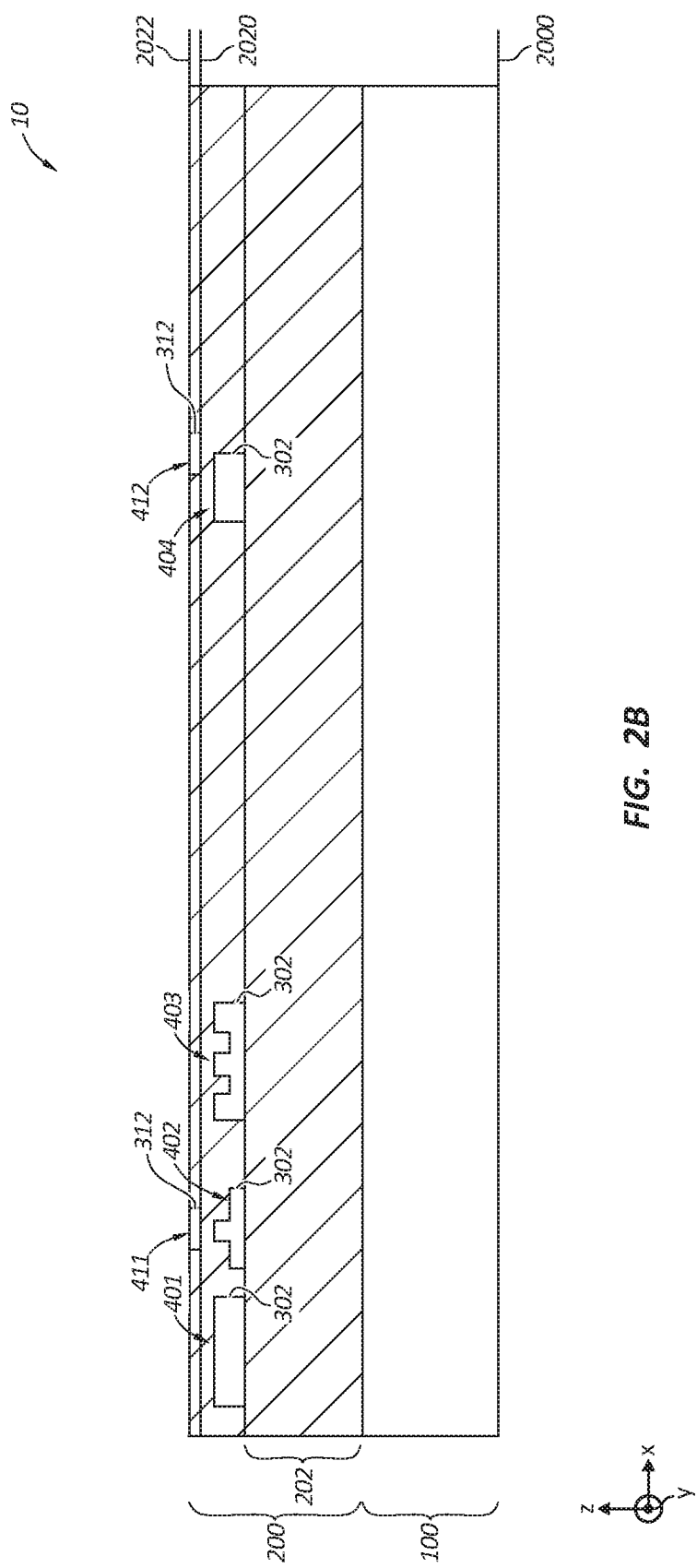

In FIG. 2B there is illustrated photonics structure 10 as shown in FIG. 2A in an intermediary stage of fabrication, after performance of further processes to define waveguide 411 and waveguide 412. Waveguides 411 and 412 can be formed of silicon nitride. For the formation of waveguides 411 and 412, layer 312 formed of silicon nitride can be deposited at an elevation 2020 and can be subject to patterning to define waveguides 411 and 412. Subsequent to the defining of waveguides 411 and 412, by patterning of layer 312, dielectric layer can be deposited over waveguides 411 and 412 and can then be subject to CMP to reduce an elevation of the formed photonics dielectric stack 200 to elevation 2022 to define a horizontally extending top surface of photonics structure 10 at elevation 2022 in the intermediary stage of fabrication shown partially defined by dielectric material, e.g. SiO2, and waveguides 411 and 412.

Figure 2C:
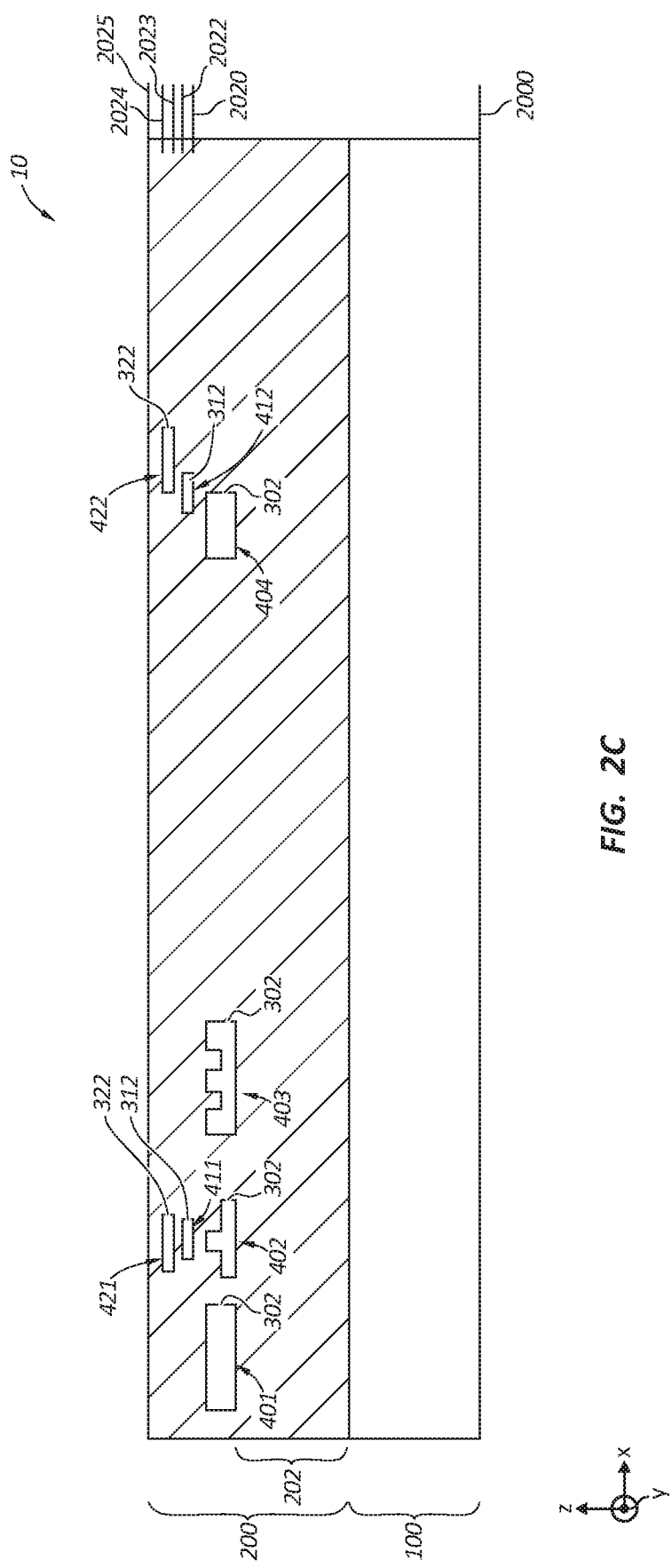

In FIG. 2C there is shown photonics structure 10 as depicted in FIG. 2B in an intermediary stage of fabrication after further patterning to define waveguide 421 and waveguide 422. For the fabrication of waveguides 421 and 422 formed of nitride a dielectric layer can be deposited on the planar horizontal surface extending in elevation 2022 followed by a further CMP process to define a horizontal plane extending at elevation 2023. At elevation 2023 layer 322 can be deposited and then subjected to patterning to define waveguides 421 and 422. Layer 322 can be subject to CMP prior to the defining of sidewalls of waveguides 421 and 422. On the patterning of waveguides 421 and 422, a layer of dielectric material can be deposited over waveguides and can then be subject to CMP to define a horizontally extending planar surface at elevation 2024. An additional layer of dielectric material can be deposited on the horizontally extending planar surface at elevation 2024 and can be subject to CMP to define a horizontally extending planar surface at elevation 2025.

Figure 2D:
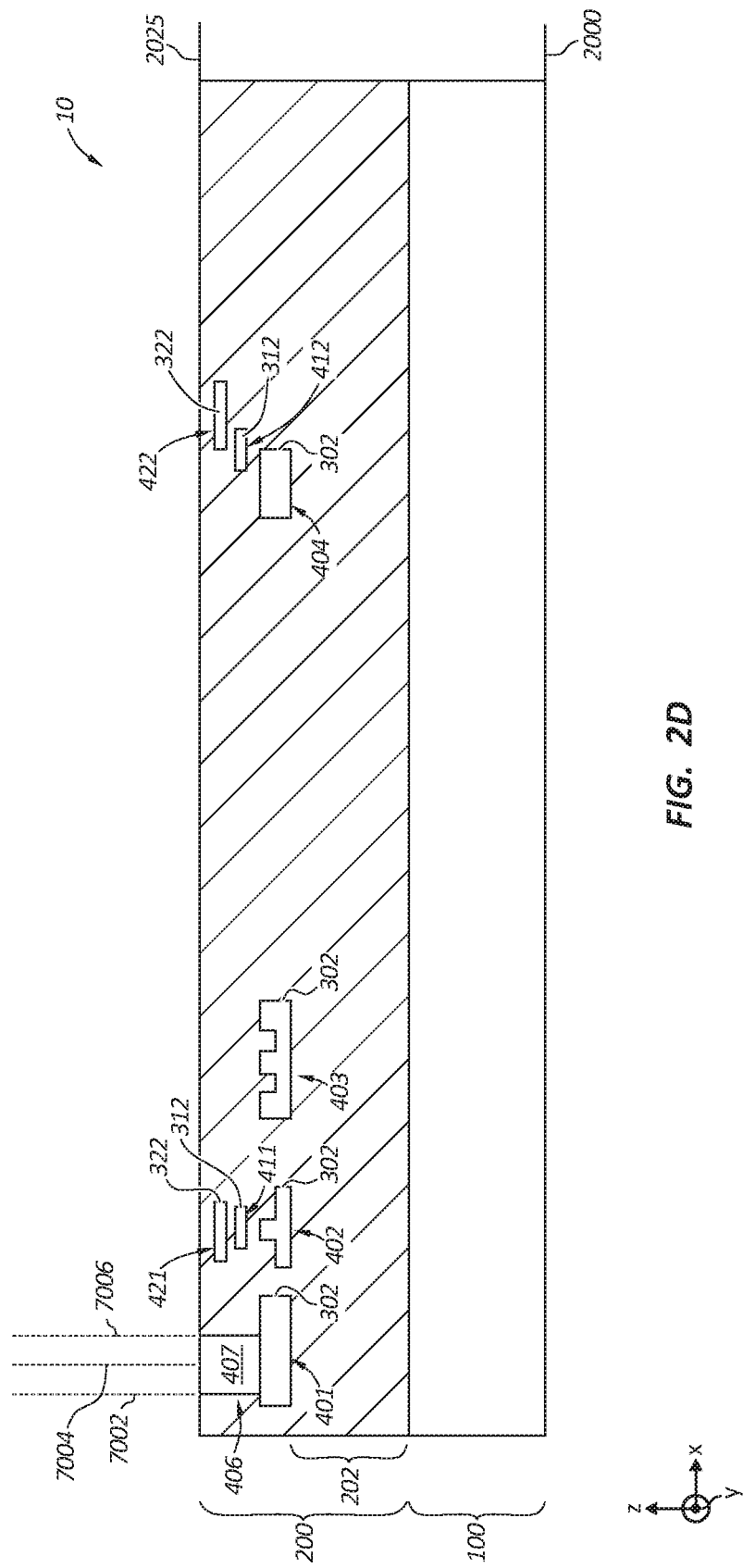

FIG. 2D illustrates photonics structure 10 as shown in FIG. 2C in an intermediary stage of fabrication after further patterning to define light sensitive material formation 407, defining photodetector 406. For the providing of light sensitive material formation 407 a plurality of layers of germanium can be epitaxially grown and annealed in a trench that can be formed between vertically extending plane 7001 and vertically extending plane 7003 formed by reactive ion etching (RIE). The formed trench can include vertically extending center axis 7002. The formed trench at the range of elevations depicted can include a perimeter intersecting vertically extending plane 7001 and vertically extending plane 7003. In one embodiment germanium can be selectively grown using reduced pressure chemical vapor deposition (RPCVD). Multiple epitaxially growing and annealing stages can be used for the formation of light sensitive material formation 407. Multiple depositing and annealing cycles, light sensitive material formation 407, e.g. formed of germanium can initially overflow the defined trench and then can be subject to CMP so that a planar horizontal surface is defined at elevation 2025.

Figure 2E:
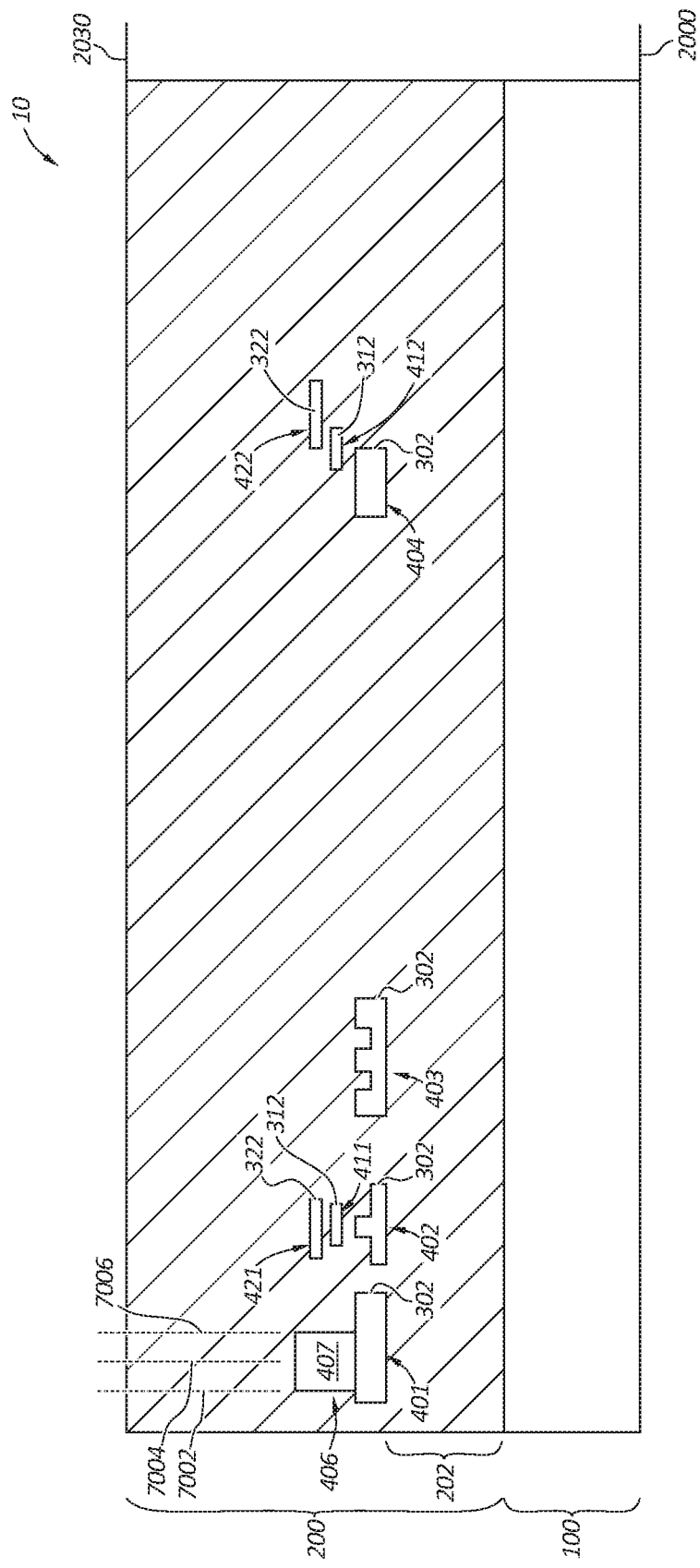

FIG. 2E illustrates photonics structure 10 as shown in FIG. 2D in an intermediary stage of fabrication after additional processing to increase an elevation of photonics dielectric stack 200. As shown in FIG. 2E subsequent to the formation of light sensitive material formation 407, an additional layer of dielectric material, e.g., SiO2 can be deposited and then subject to CMP to define a horizontal planar top surface of photonics dielectric stack 200 at elevation 2030 as shown in the intermediary fabrication stage view of FIG. 2E.

Figure 2F:
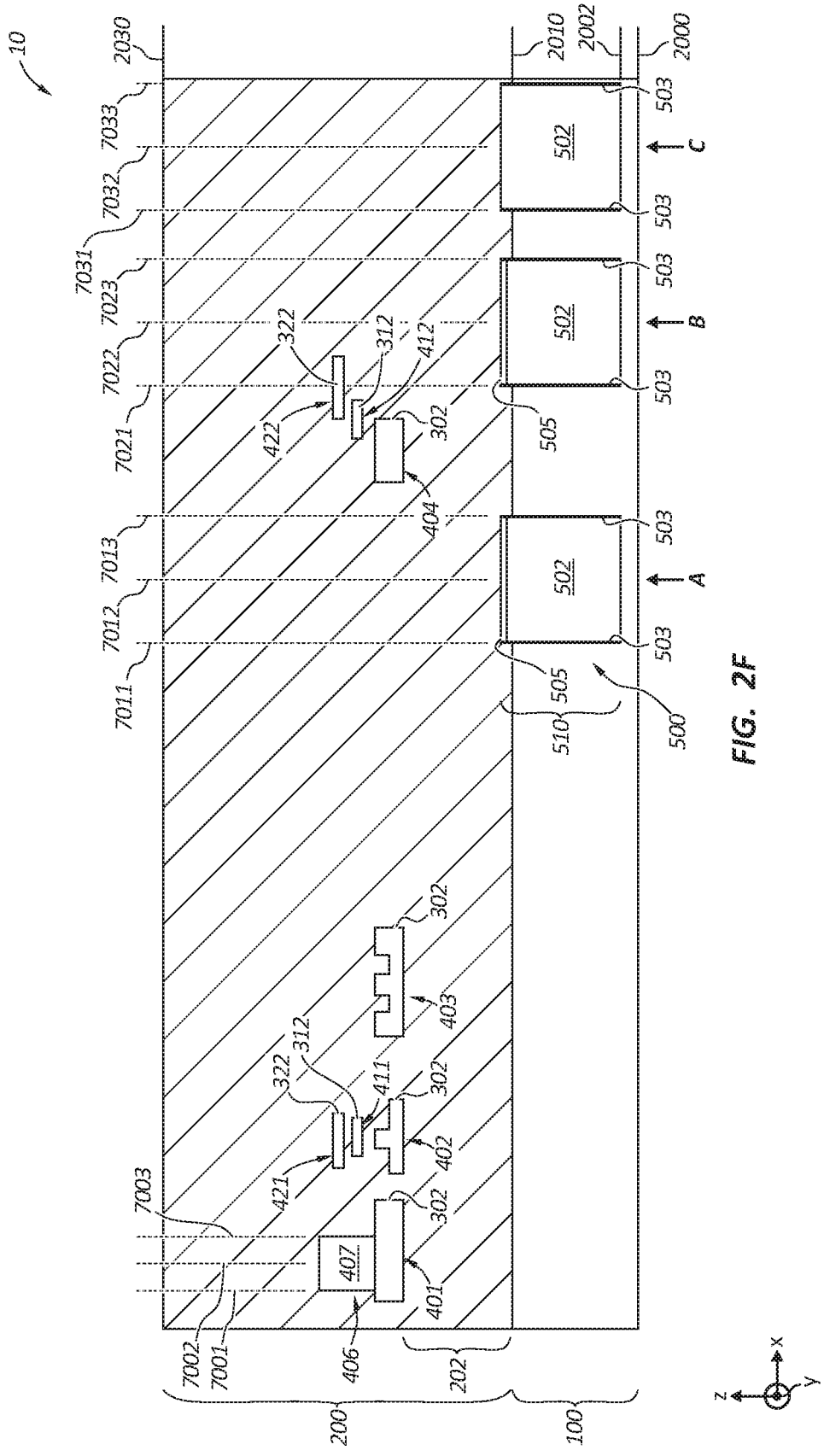

In FIG. 2F there is shown photonics structure 10 as shown in FIG. 2E in an intermediary stage of fabrication after initial fabrication to define buffer material formations 502 defining laser stacks 510 and integrated laser light sources 500. For providing buffer material formations 502 generally at locations A, B, and C respectively, first, second, and third trenches can be generated at locations A, B, and C.

A first trench can have a vertically extending center axis 7012 and can include sidewalls within photonics dielectric stack 200 intersecting vertically extending plane 7011 and vertically extending plane 7013. A second trench can have a vertically extending center axis 7022 and can have vertically extending sidewalls intersecting vertically extending plane 7021 and vertically extending plane 7023. A third trench can have a vertically extending center axis 7032 and can have sidewalls intersecting vertically extending plane 7031 and vertically extending plane 7033. The formed first, second, and third trenches can extend from bottom elevation 2002 to top elevation 2030.

The formation of each of the first, second, and third trenches generally at locations A, B, and C can include a two stage RIE process. In a first RIE stage wherein material can be etched to elevation 2010 etching can be performed that is selective to oxide so that oxide material defining photonics dielectric stack 200 is removed without removal of silicon defining substrate 100 in the described embodiment. In a second RIE stage etching can be performed selective to silicon so that material of substrate 100 is removed without removal of oxide defining photonics dielectric stack 200.

With the trenches formed having respective vertically extending center axes 7012, 7022, and 7032 a layer 503 formed of dielectric material and providing a dielectric liner can be deposited. Layer 503 can initially have a sacrificial portion that extends the respective bottoms of the formed trenches having center axes 7012, 7022, and 7032. That is, layer 503 of each integrated laser light source 500 can initially have bottom elevations adjacent to and formed on material of substrate 100 formed of silicon at elevation 2010.

Buffer material formation 502 can be epitaxially grown on silicon defining substrate 100. For epitaxially growing an initial layer of material defining buffer material formation 502, material of layer 503 can be removed from a bottom of the respective trenches associated to axes 7012 and 7022, and 7032 to expose the silicon surface of substrate 100 at elevation 2002. For removal of material of layer 503 at the bottom of the respective trenches, a punch through RIE process can be used that is selective to dielectric material, e.g. SiO2 forming layer 503 so that dielectric material of layer 503 is removed without removal of silicon that forms substrate 100.

Buffer material formation 502 can be grown using a multistage growing and annealing process, wherein layers forming buffer material formation 502 can be epitaxially grown and then annealed. Material that can be epitaxially grown to form buffer material formation 502 include III-V material, e.g. gallium arsenide or gallium phosphide. Prior to the growing of an initial layer of III-V material, a bottom surface of trenches associated with center axes 7012 and 7022, and 7032 can be subject to further treatment, e.g. treatment to clean RIE products and/or treatment to epitaxially grow a thin layer of silicon, e.g. monocrystalline silicon on the silicon surface (monocrystalline defining a bottom of the trenches associated with center axes 7012 and 7022, and 7032). Multiple epitaxially growing and annealing stages can be used for the providing of buffer material formations 502. Embodiments herein recognize that when III-V material is epitaxially grown on a silicon surface defining a bottom of the trench, there will be a lattice mismatch which can induce defects. Annealing stages can be used to annihilate defects.

Growing and annealing of III-V material to provide buffer material formations 502 can be performed using a restricted thermal budget. Employing a restricted thermal budget for the fabrication of buffer material formations 502 can mitigate thermal degradation of photonics devices, such as photonics devices and components 401-406, 411-412, and 421-422. According to one embodiment, epitaxially growing stages for epitaxially growing layers forming buffer material formations 502 can be performed at a temperature of between about 400° C. and about 600° C., whereas annealing stages for annealing of defined sublayers of buffer material formations 502 can be performed at temperatures of from between about 500° C. and about 700° C.

Buffer material formation 502 can be formed of, e.g. gallium arsenide (GaAs) deposited with multiple epitaxially growing and annealing cycles, with annealing cycles being performed for removal of defects to provide a low defect density of buffer material formation 502. Buffer material formation 502 can include a thickness, e.g. in the range of from about 1000 nm to about 4000 nm according to one embodiment. Buffer material formation 502 according to one embodiment can be formed primarily of gallium arsenide (GaAs). According to one embodiment, buffer material formation 502 can include a gallium arsenide (GaAs)/indium gallium arsenide (InGaAs) strained superlattice (SSL). An SSL can be included in buffer material formation 502 to mitigate treading location defect (TDD) propagation to active region 515. The SSL can also reduce surface roughness. Buffer material formation 502 according to one embodiment, can include a specialized bottom layer e.g. deposited on, e.g. directly on a silicon surface of substrate 100. The specialized bottom layer can include e.g. GaP/Si or GoVS (001) and can mitigate anti-phase domain defects (APDs).

With further reference to the stage view of FIG. 2F, each buffer material formation 502 on being grown to an elevation exceeding elevation 2010 depicted as a top elevation of substrate 100 can be subject to treatment to define a planar horizontal surface at about elevation 2010. At locations A and B, contact layer 505 can be deposited on a top surface of buffer material formation 502. Contact layer 505 can include, e.g. gallium arsenide (GaAs) doped with an N type dopant, e.g. silicon (Si). Contact layer 505 can include a thickness in the range of from about 100 nm to about 500 nm.

At location C, buffer material formation 502 can be absent of an associated deposited contact layer deposited thereon as in locations A and B. Subsequent to the formation of contact layer 505 by the process of ion implantation at locations A and B, the trenches associated with vertically extending center axes 7012 and 7022, and 7032 can be filled with oxide. Oxide can be deposited within the various trenches associated to center axes 7012 and 7022, and 7032 and can overfill the trenches. Photonics structure 10 can then be subject to CMP to reduce a top elevation of photonics dielectric stack 200 so that a planar and horizontally extending surface is defined at elevation 2030.

Buffer material formation 502 can provide a defect reduced interface for growing of remaining structures of laser stack 510. A laser stack 510 can include in addition to buffer material formation 502, contact layer 505, aluminum tuning layer 511A, cladding layer 512A, aluminum tuning layer 513A, spacer layer 514, active region 515, patterned layer 516, aluminum tuning layer 513B, cladding layer 512B, aluminum tuning layer 511B, and contact layer 506. Active region 515 can include quantum dots. In some embodiments buffer material formation 502 can be sacrificially formed, i.e. fabricated and then removed prior to fabricating of photonics structure 10 in its final form, e.g. as a photonics integrated circuit chip.

Figure 2G:
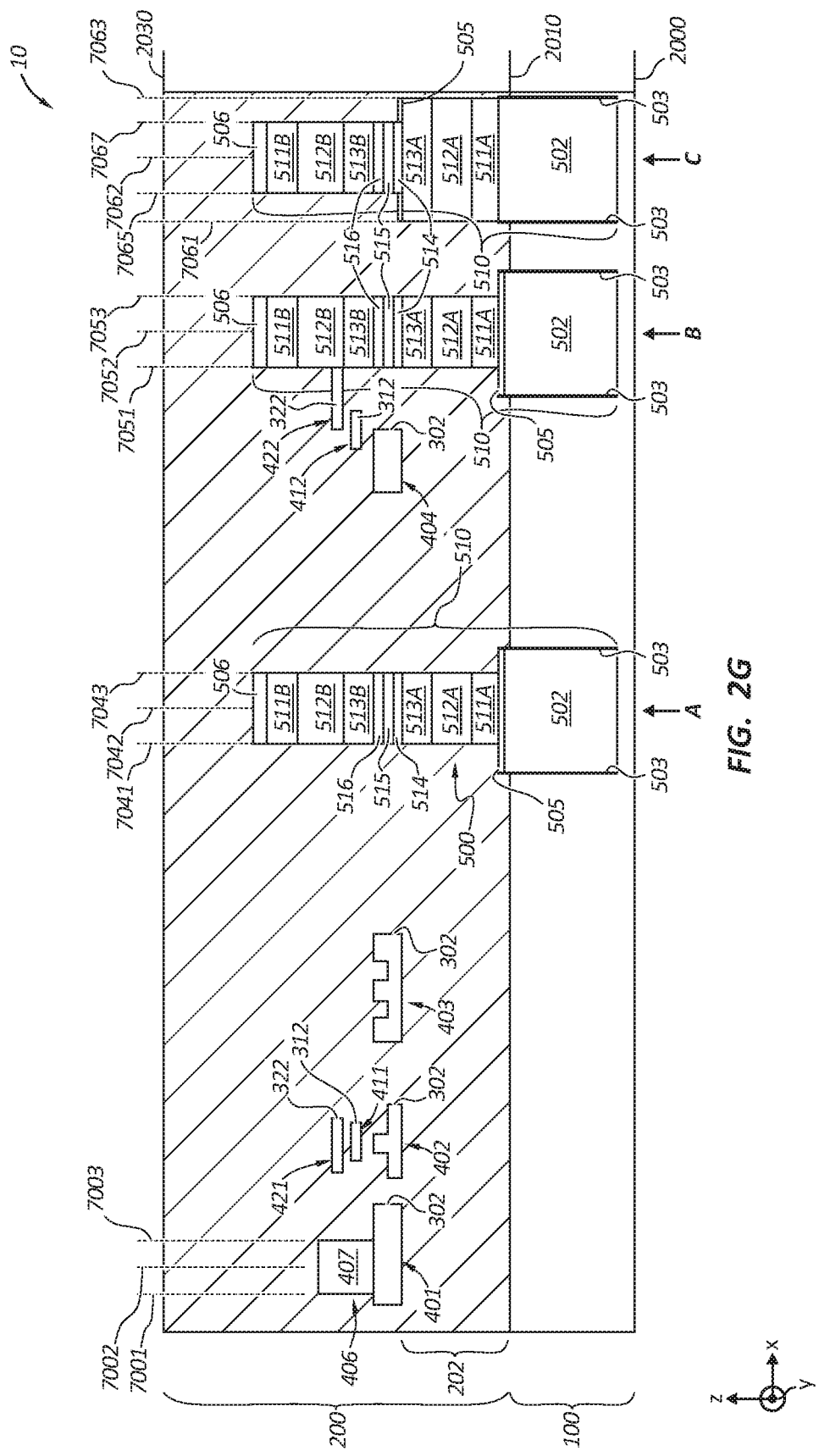

FIG. 2G illustrates photonics structure 10 as shown in FIG. 2F in an intermediary stage of fabrication after performance of further processes to grow additional layers of respective laser stacks 510 generally at locations A, B, and C.

For growing of additional layers of laser stacks 510, stack trenches can be formed in photonics dielectric stack 200. Referring to FIG. 2G a first trench generally at location A can be formed having vertically extending center axis 7042 and sidewalls intersecting vertically extending planes 7041 and 7043. A second trench formed generally at location B can be formed having vertically extending center axis 7052 and sidewalls intersecting vertically extending planes 7051 and 7053. A third trench formed generally at location C can be formed having vertically extending center axis 7062 and sidewalls intersecting vertically extending planes 7061 and 7063. The first and second laser stack trenches can extend downward to have bottom surfaces defined by contact layer 505 formed of conductive material. The laser stack trench at location C can extend downward to have a bottom surface defined by a top surface of buffer material formation 502 at location C.

Referring to FIG. 2G aluminum tuning layer 511A can be deposited within each trench at location A, B, and C followed by cladding layer 512A which can be deposited on aluminum tuning layer 511A. At location A and B the aluminum tuning layer 511A can be epitaxially grown on contact layer 505. At location C, aluminum tuning layer 511A can be epitaxially grown on buffer material formation 502. With cladding layer 512A formed, aluminum tuning layer 511A of each laser stack 510 can be deposited by epitaxially growing of aluminum tuning layer 511A on cladding layer 512A.

Aluminum tuning layer 511A can be formed of a plurality of sublayers, each sublayer having a different index of a refraction. The different sublayers of aluminum tuning layer 511A can have different concentrations of aluminum. The different concentrations of aluminum can result in different indices of refraction. The concentrations of aluminum can transition from about 40% aluminum at distances farthest away from active region 515 to concentrations of about 0% aluminum at locations of aluminum tuning layer in closest proximity to active region 515. The index of refraction of aluminum tuning layer 511A can increase at distances closer to active region 515 which can reduce concentration of aluminum (Al).

Cladding layer 512A provide light confinement and also separates the active region 515 and the contact layer 505. Cladding layer 512A can be formed of, e.g. aluminum gallium arsenide (AlGaAs) having a fixed concentration of aluminum, e.g. 40% aluminum concentration. Cladding layer 512A according to one embodiment can include a thickness in the range of from about 500 nm to about 2000 nm.

With cladding layer 512A formed, aluminum tuning layer 513A can be epitaxially grown on cladding layer 512A. During the growth of the tuning layer 513A, the aluminum content of this region is adjusted to enable a transition from about 40% aluminum at the interface of layer 512A to 0% at the junction between 513A and the spacer layer 514. The thickness of 513A ranges from 50 nm to 100 nm.

Cladding layer 512A and aluminum tuning layers 511A and 513A can function to confine light and can mitigate light interaction with lossy contact layer 505.

At the laser stack trenches of locations A, B, and C, spacer layer 514 can be epitaxially grown on the top surface of aluminum tuning layer 513A, followed by active region 515 which can be epitaxially grown on spacer layer 514 and patterned layer 516 which can be epitaxially grown on active region 515. Spacer layer 514 can be formed, e.g. of gallium arsenide (GaAs) and can have a thickness in the range of from about e.g. 200 nm to about 700 nm. Patterned layer 516 can have a thickness in a range of from about e.g. 200 nm to about 1000 nm.

Active region 515 can be defined by a layer that includes multiple sublayers, e.g. including from about 3 to about 9 sublayers formed of indium gallium arsenide (InGaAs) and defining quantum dots and from about 3 to 9 sublayers of gallium arsenide (GaAs). The respective thin layers (e.g. about 40 nm) of gallium arsenide (GaAs) can separate the InGaAs layers defining quantum dots. Active region 515 can include N repeats of the following layers: {indium gallium arsenide (InGaAs) embedded quantum dots/indium gallium arsenide (InGaAs)/gallium arsenide (GaAs)}xN wherein N can range from about 3 to about 9.

Active region 515 according to one embodiment can include a plurality, e.g. from about 3 to about 9 sublayers of epitaxially grown indium gallium arsenide (InGaAs) layers with embedded quantum dots and a gallium arsenide. Each of the sublayers can include a thickness, e.g. of about 3 nm to about 50 nm. According to one embodiment, each layer of quantum dots can be separated by a layer of gallium arsenide (GaAs) having a thickness of about 40 nm so that active region 515 has a thickness in the range of from about 150 nm to 500 nm.

Patterned layer 516 can be formed e.g. of gallium arsenide (GaAs) and can be patterned for selection of the wavelength at which active region 515 operates. Patterned layer 516 can be patterned e.g. as a waveguide and/or as a grating. Patterned layer 516 according to one embodiment can have a thickness e.g. of from about 50 nm to about 100 nm.

Patterned layer 516 can be formed, e.g. of gallium arsenide (GaAs) and can be patterned to form a grating, e.g. double side band (DSB) grating or can be alternatively patterned to define a reflector, e.g. a distributed Bragg reflector (DBR). Patterned layer 516 can be patterned to define, e.g. a grating or reflector for use in selecting an operational band of laser stack 510. Patterned layer 516 can be patterned for selection of an operating wavelength.

For each laser stack 510 at location A, B, and C, aluminum tuning layer 513B can be epitaxially grown on patterned layer 516, cladding layer 512B can be epitaxially grown on aluminum tuning layer 513B and aluminum tuning layer 511B can be epitaxially grown on cladding layer 512B.

Aluminum tuning layer 513B can be formed of a plurality of sublayers, each sublayer having a different index of a refraction. The different sublayers of aluminum tuning layer 513B can have different concentrations of aluminum. The different concentrations of aluminum can result in different indices of refraction. The concentrations of aluminum can transition from about 40% aluminum at distances farthest away from active region 515 to concentrations of about 0% aluminum at locations of aluminum tuning layer in closest proximity to active region 515. The index of refraction of aluminum tuning layer 513B can increase at distances closer to active region 515 as a result of the reduced concentration of aluminum (Al).

Cladding layer 512B can provide light confinement and can provide spacing between aluminum tuning layer 513B and aluminum tuning layer 513A. Cladding layer 512B can be formed of, e.g. aluminum gallium arsenide (AlGaAs) having a fixed concentration of aluminum, e.g. 40% aluminum concentration. Cladding layer 512B according to one embodiment can include a thickness in the range of from about 500 nm to about 2000 nm.

With cladding layer 512B formed, aluminum tuning layer 511B can be epitaxially grown on cladding layer 512B. Aluminum tuning layer 511B can be formed of a plurality of sublayers, each sublayer having a different index of a refraction. The different sublayers of aluminum tuning layer 511B can have different concentrations of aluminum. The different concentrations of aluminum can result in different indices of refraction. The concentrations of aluminum can transition from about 40% aluminum at distances farthest away from active region 515 to concentrations of about 0% aluminum at locations of aluminum tuning layer 511B in closest proximity to active region 515. The index of refraction of aluminum tuning layer 511B can increase at distances closer to active region 515 which can reduce concentration of aluminum (Al).

Cladding layer 512B and aluminum tuning layers 511B and 513B can function to confine light and can mitigate light interaction with contact layer 506 which can be a lossy contact layer.

With aluminum tuning layer 511B formed, contact layer 506 can be epitaxially grown on aluminum tuning layer 511B. Conductive material forming contact layer 506 can include e.g. gallium arsenide (GaAs) doped with e.g. Beryllium (Be), Zinc (Zn) or Carbon (C) (p-type contact). Thickness of contact layer 506 can be in a range of e.g. from about 100 nm to about 500 nm. Contact layer 506 can be formed of, e.g. gallium arsenide (GaAs) doped with a p type dopant, e.g. Beryllium (Be), zinc (Zn) or carbon (C). Contact layer 506 can include a thickness in the range of from about 100 nm to about 500 nm.

Further details of laser stack 510 according to one embodiment are set forth in reference to Table A.

TABLE A

| Structure | Material and Process Conditions |
|---|---|
| buffer material formation 502 | GaAs can be deposited with multiple epitaxially growing and annealing cycles; thickness in a range of e.g. about 1000 nm to about 4000 nm |

TABLE A-continued

| Structure | Material and Process Conditions |
| --- | --- |
| contact layer 505 | GaAs can be doped with Si (n type contact layer); thickness in a range of e.g. about 100 nm to about 500 nm |
| aluminum tuning layer 511A | Al(x)Ga(1 − x)As can be epitaxially grown where the Al mole fraction is increased from about 0.0 to about 0.4; thickness can be in a range of e.g. about 50 nm to about 100 nm. |
| cladding layer 512A | Al(0.4)Ga(0.6)As can be epitaxially grown with thickness in a range of e.g. about 500 nm to about 2000 nm. |
| aluminum tuning layer 513A | Al(x)Ga(1 − x)As can be epitaxially grown where the Al mole fraction is decreased from about 0.4 to about 0.0; thickness can be in a range of e.g. about 50 nm to about 100 nm. |
| spacer layer 514 | GaAs can be epitaxially grown with thickness in a range of e.g. about 50 nm to about 100 nm. |
| active region 515 | {InGaAs/InAs QDs/InGaAs/GaAs}xN can be epitaxially grown where N range from about 3 to about 9; thickness of active region 515 can be in a range of e.g. about 150 nm to about 450 nm, with each sublayer in the range of from about 3 nm to about 50 nm. |
| patterned layer 516 | Layer formed of e.g. GaAs be patterned for selection of the wavelength at with the laser operates; thickness in a range of e.g. about 50 nm to about 100 nm. Patterned layer 516 can be patterned e.g. as a waveguide and/or as a grating. |
| aluminum tuning layer 513B | Al(x)Ga(1 − x)As can be epitaxially grown where the Al mole fraction is increased from about 0.0 to about 0.4; thickness can be in a range of e.g. about 50 nm to about 100 nm. |
| cladding layer 512B | Al(0.4)Ga(0.6)As can be epitaxially grown with thickness in a range of e.g. about 500 nm to about 2000 nm. |
| aluminum tuning layer 511 B | Al(x)Ga(1 − x)As can be epitaxially grown where the Al mole fraction is decreased from about 0.4 to about 0.0; thickness can be in a range of e.g. about 50 nm to about 100 nm. |
| contact layer 506 | GaAs can be doped with e.g. Beryllium (Be), Zinc (Zn) or Carbon (C) (p-type contact), thickness can be in a range of e.g. from about 100 nm to about 500 nm. |

Laser stack 510 according to one embodiment can include buffer material formation 502 epitaxially grown on defined surface of substrate 100 formed of silicon, contact layer 505 epitaxially grown on buffer material formation 502, aluminum tuning layer 511A epitaxially grown on buffer material formation 502, cladding layer 512A epitaxially grown on aluminum tuning layer 511A, aluminum tuning layer 513A epitaxially grown on cladding layer 512A, spacer layer 514 epitaxially grown on aluminum tuning layer 513B, active region 515 epitaxially grown on aluminum tuning layer 513B, patterned layer 516 epitaxially grown on active region 515, aluminum tuning layer 513B epitaxially grown on active region 515, cladding layer 512B epitaxially grown on aluminum tuning layer 513B, aluminum tuning layer 513B epitaxially grown on cladding layer 512B, and contact layer 506 epitaxially grown on aluminum tuning layer 511B.

Laser stacks 510 can have a diameter at the depicted lower elevations in a range of from about 2 um to about 10 um, and a diameter at the depicted upper elevations in a range of from about 1 um to about 5um according to one embodiment. Laser stacks 510 can have a total height (bottom of structure 502 to top of structure 506) in a range of from about 2 um to about 20 um according to one embodiment, and from about 4 um to about 12 um according to one embodiment. Buffer material formations 502 of laser stacks 510 can have a height in a range of from about 1 um to about 5 um according to one embodiment and from about 2 um to about 4 um according to one embodiment. The combination of structures from 505, 511A, 512A, 513A, 514, 515, 516, 513B, 512B, 511B, and 506 can have a height in a range of from about 1 um to about 10 um according to one embodiment, and from about 2 um to 6 um according to one embodiment.

As set forth herein voltage can be applied by associated contacts across contact layer 505 and contact layer 506 of each laser stack 510. Such an applied voltage can induce a flow of electrons through structures 511A, 512A, 513A, 514, 515, 516, 513B, 512B, and 511B of a laser stack 510. Each active region 515 can include a conduction band and a valance band. Applying a voltage between contact layer 505 and contact layer 506 can assure that an abundance of electrons reside in a conduction band of an active region 515 and can assure that an abundance of holes reside in a valance band of active region 515 to thus provide conditions suitable for the emission of light by active region 515. Active region 515 can include an associated horizontally extending longitudinal axis. Active region 515 can emit light in a direction parallel to the horizontally extending longitudinal axis.

Cladding layers 512A and 512B and aluminum tuning layers 511A, 513A, 513B, 511B of laser stack 510 can be configured to aid in the confinement of light within active region 515 and can inhibit light interacting with contact layer 505 and contact layer 506 respectively. For confinement of light within active region 515, each laser stack 510 can include a highest index of refraction within active region 515 and can include reduced indices of refraction at spacing distances within laser stack 510 increasing from active region 515. Aluminum tuning layers 511A, 513A, 513B, 511B can include continuously increasing concentrations of aluminum (Al) as distances increase from active region 515 and can include continuously decreasing indices of refraction as spacing distances increase from active region 515.

For the formation of aluminum tuning layers 511A, 513A epitaxially grown on a preceding layer of laser stack 510, deposition parameters can be controlled so that the feedstock of aluminum (Al) is iteratively decreased as the aluminum tuning layer 511A, 513A is epitaxially grown. For the deposition of aluminum tuning layer 513B, 511B epitaxially grown on spacer layer 514, the deposition parameters can be controlled so that a feedstock of aluminum (Al) is iteratively increased as aluminum tuning layer 513B, 511B defining a second gradient layer is epitaxially grown.

Various deposition technologies can be utilized for the epitaxial growth of structures 502, 505, 513A, 512A, 511A, 514, 515, 516, 513B, 512B, 511B, and 506. According to one embodiment, structures 502, 505, 513A, 512A, 511A, 514, 515, 516, 513B, 512B, 511B, and 506 can be epitaxially grown using molecular beam epitaxy (MBE). The various structures 502, 505, 513A, 512A, 511A, 514, 515, 516, 513B, 512B, 511B, and 506 can be epitaxially grown at one or more temperature within a temperature range of from about 500° C. to about 700° C. according to one embodiment. According to one embodiment, a deposition temperature can be maintained at a sufficiently low temperature so as not to degrade previously fabricated photonics devices and components such as structures 401-404, 406-408, 411-412, 421-422. According to one embodiment epitaxially grown structures 502, 505, 513A, 512A, 511A, 514, 515, 516, 513B, 512B, 511B, and 506 can be epitaxially grown using metal organic chemical vapor deposition (MOCVD). According to one embodiment, the various structures 502, 505, 513A, 512A, 511A, 514, 515, 516, 513B, 512B, 511B, and 506 can be epitaxially grown using MOCVD at one or more temperature within a temperature range of from about 550° C. to about 750° C.

According to one embodiment a fabrication temperature for fabricating structures of laser stack 510 can be reduced for fabrication of active region 515 and subsequent structures. Embodiments herein recognize that active region 515 an be subject to performance degradation by subsequent processes at higher temperatures. Accordingly, conditions for fabrication of laser stack 510 can be controlled so that a temperature for fabrication of active region 515 and ensuing structures can be reduced. For example, according to one embodiment, the temperature for epitaxially growing (and annealing where applicable) of the structures of laser stack 510 may be reduced for the formation of active region 515 and ensuing structures so that structures 516, 513B, 512B, 511B, and 506 epitaxially grown subsequent to the formation of active region 515 are fabricated at temperatures of at least about 25° C. less than a highest temperature used for fabricating structures preceding active region 515. The active region 515 can be epitaxially grown at about 500° C. according to one embodiment and can be epitaxially grown using MOCVD or MBE with annealing temperatures in the temperature range of from about 550° C. to about 580° C. According to one embodiment, MOCVD can be used for the formation of structures 502, 505, 511A, 512A, 513A, and MBE can be used for the epitaxially growing of structures 514, 515, 516, 513B, 512B, 511B and 506.

For growing of laser stack 810, temperature budgets can be applied. A lower stack temperature budget can be applied for the fabrication of structures below active region 515, namely structures 502, 505, 511A, 512A, 513A, and 514. The lower stack temperature budget can be applied for protection of previously fabricated photonics so as not to degrade previously fabricated photonics devices and components such as structures 401-404, 406-408, 411-412, 421-422. According to one embodiment the lower stack temperature budget limit can be established to be about 650° C. so that deposition and annealing temperatures for the fabrication of structures below active region 515, namely, structures 502, 505, 511A, 512A, 513A, and 514 does not exceed about 650° C. According to one embodiment the lower stack temperature budget limit can be established to be about 625° C. so that deposition and annealing temperatures for the fabrication of structures below active region 515, namely, structures 502, 505, 511A, 512A, 513A, and 514 does not exceed about 625° C. According to one embodiment the lower stack temperature budget limit can be established to be about 600° C. so that deposition and annealing temperatures for the fabrication of structures below active region 515, namely, structures 502, 505, 511A, 512A, 513A, and 514 does not exceed about 600° C. According to one embodiment the lower stack temperature budget limit can be established to be about 580° C. so that deposition and annealing temperatures for the fabrication of structures below active region 515, namely, structures 502, 505, 511A, 512A, 513A, and 514 does not exceed about 580° C.

An upper stack temperature budget can be applied for the fabrication of structures including and above active region 515, namely structures 515, 516, 513B, 512B, 511B, and 506. The upper stack temperature budget can be applied for protection of active region 515. According to one embodiment the upper stack temperature budget limit can be established to be about 650° C. so that deposition and annealing temperatures for the fabrication of structures including and above active region 515, namely, structures 515, 516, 513B, 512B, 511B, and 506 does not exceed about 650° C. According to one embodiment the upper stack temperature budget limit can be established to be about 625° C. so that deposition and annealing temperatures for the fabrication of structures including and above active region 515, namely, structures 515, 516, 513B, 512B, 511B, and 506 does not exceed about 625° C. According to one embodiment the upper stack temperature budget limit can be established to be about 600° C. so that deposition and annealing temperatures for the fabrication of structures including and above active region 515, namely, structures 515, 516, 513B, 512B, 511B, and 506 does not exceed about 600° C. According to one embodiment the upper stack temperature budget limit can be established to be about 580° C. so that deposition and annealing temperatures for the fabrication of structures including and above active region 515, namely, structures 515, 516, 513B, 512B, 511B, and 506 does not exceed about 580° C. According to one embodiment, the upper stack temperature budget limit can be established to be lower that the lower stack temperature budget limit. According to one embodiment, each of the upper stack temperature budget limit the lower stack temperature budget limit can be established to be lower than a temperature budget limit for fabrication of photonics devices and components such as structures 401-404, 406-408, 411-412, 421-422.

With the input of electrical energy, electrons can be injected into laser stack 510. Laser stack 510 of each laser light source 500 can be configured to facilitate a flow of electrons through the laser stack 510 with a high density of electrons formed in the active region 515. The flow of electrons can be facilitated with appropriate electrical energy inputs at bottom contact layer 505 and/or top contact layer 506 made through contacts fabricated as set forth herein. With electrons occupying active region 515 of a laser stack 510 the device can emit light.

Figure 2H:
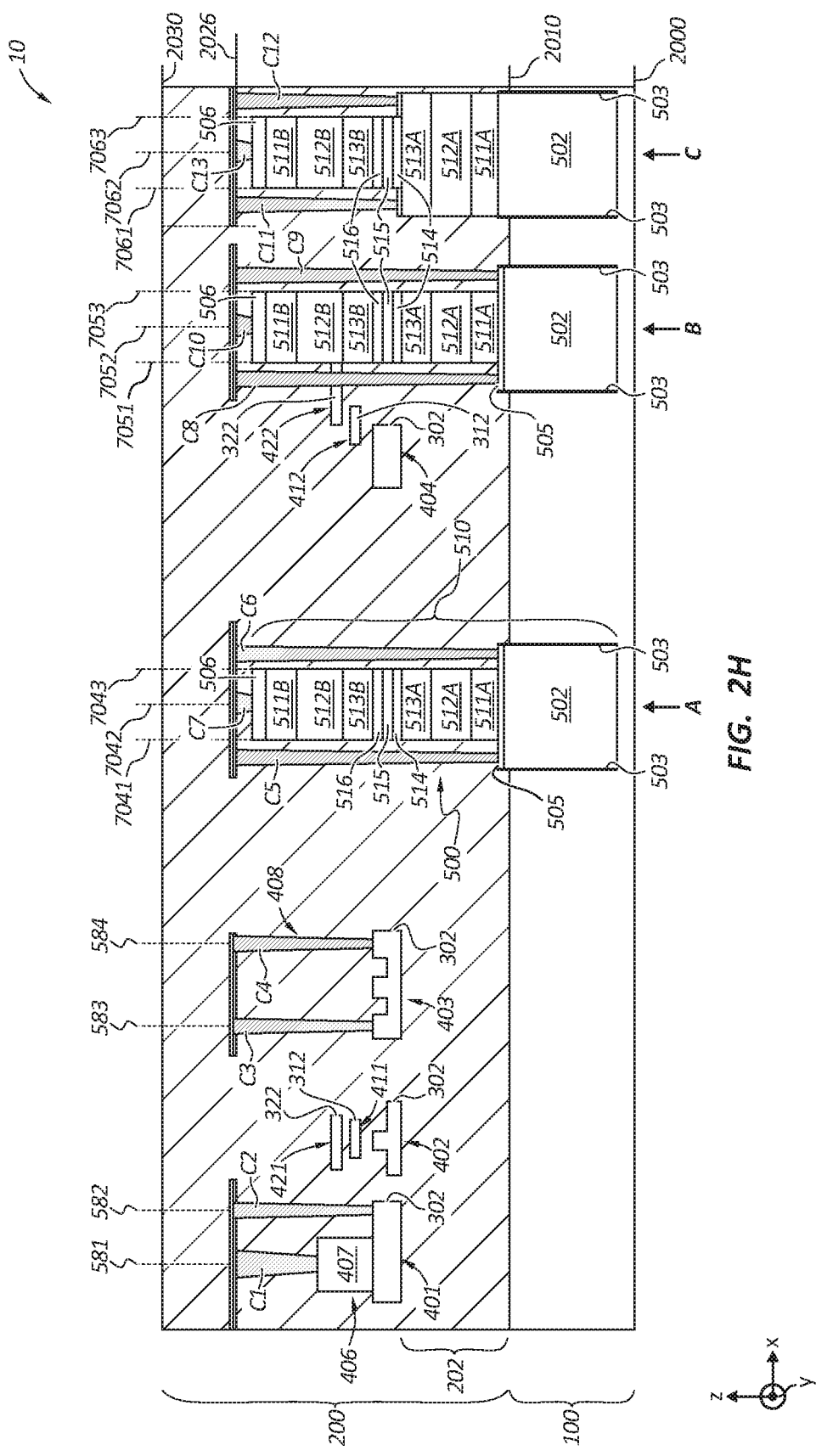

FIG. 2H illustrates photonics structure 10 shown in FIG. 2G in an intermediary stage of fabrication after performing processes for the fabrication of contacts C1-C13. For the formation of contacts C1-C13 contact trenches having respective vertically extending center axes can be etched in photonics dielectric stack 200. Following the formation of the contact trenches, the contact trenches can be filled with contact conductive material, e.g. conductive metal. The conductive material can be deposited to overfill the conductive material trenches and then can be subject to CMP to define a horizontally extending planar surface at elevation 2026.

Figure 2I:
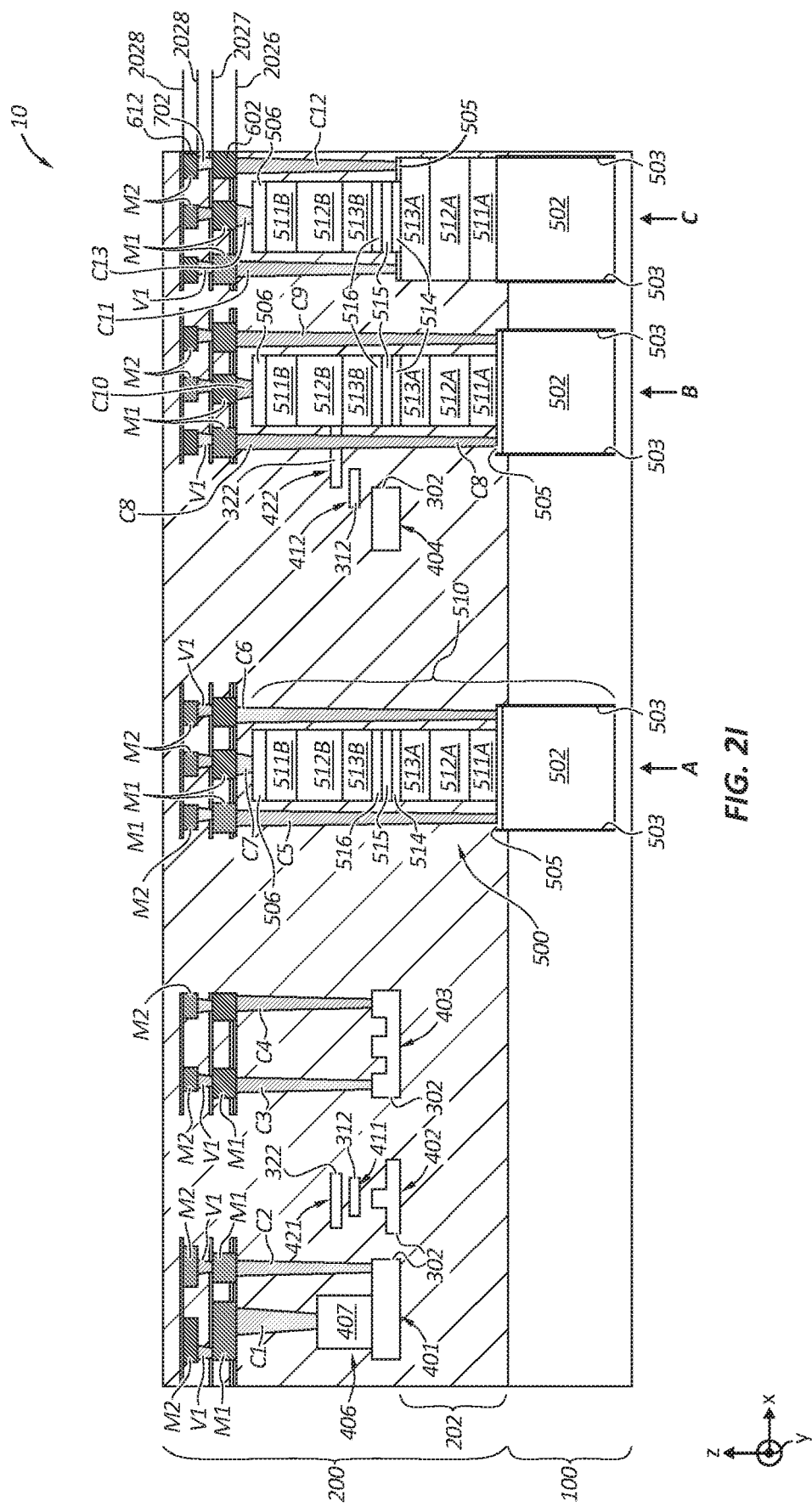

FIG. 2I illustrates the photonics structure 10 as shown in FIG. 2H in an intermediary stage of fabrication subsequent to further processing to define metallization layer 602, vias layer 702, and metallization layer 612. For the formation of metallization layer 602 trenches can be formed in photonics dielectric stack 200 to extend to a bottom elevation defined at elevation 2026 which is the top elevation of contacts C1-C13. For the formation of metallization layer 602 metallization layer formation trenches can be formed to include center axes at the centers of metallization layer formations M1 shown in FIG. 2I. The metallization layer trenches can be overfilled with conductive metal material and then subject to CMP to define a planar horizontal surface at the depicted top elevation 2027 of metallization layer formations. A dielectric layer can then be deposited and then subject to CMP to increase the elevation of photonics dielectric stack 200 to elevation 2028 and vias trenches can be formed to include center axes at the vertical centers of respective vias V1 as shown in FIG. 2I.

The vias trenches can be overfilled and subject to CMP so that a top elevation of photonics dielectric stack 200 is defined at elevation 2028, the top of vias V1. Dielectric material, e.g. oxide can be deposited on the horizontal surface defined at elevation 2028 and then can be subject to CMP to define a horizontal planarized surface at elevation 2029. Metallization layer trenches can be formed in photonics dielectric stack 200 having metallization layer trench center axes at the center axes of respective metallization layer formations M2 as shown in FIG. 2I. The metallization layer trenches can be overfilled and subject to CMP to define a horizontally extending planar surface at elevation 2029, and then a further layer of dielectric material, e.g. oxide can be deposited on the horizontally extending surface at elevation 2024 which additional layer can be subject to CMP to define a top elevation in the intermediary stage view of photonics dielectric stack 200 at elevation 2030.

All of the components depicted within photonics dielectric stack 200 of FIGS. 2A-2H can be integrally formed and fabricated within photonics dielectric stack 200 using semiconductor device processes characterized by photolithography semiconductor device fabrication stages and/or chemical semiconductor device fabrication stages.

In the fabrication stage of FIG. 2H, there is described a process wherein bottom contacts, e.g., contacts C5, C6, C8, C9, C11 and C12 for respective laser sources are fabricated with use of top side metallization. For example, for the formation of contact C5, a trench can be formed through a top surface of photonics structure 10 and filled with conductive material.

Contact layer 505 of the laser stack 510 at location "C" is shown as having a higher elevation than the laser stacks of locations "A" or "B". Locating contact layer 505 at a higher elevation can reduce energy. On the deposition of aluminum tuning layer 513A the laser stack trenches at location A and B having associated center axes 7042 and 7052 can be covered with masking material and contact layer 505 formed of conductive material can be deposited on aluminum tuning layer 513A at location C. The laser stack trench at location C can then be filled with dielectric material and the laser stack trench can be re-formed to have a center centered again on center axis 7062 and a narrower diameter to define sidewalls intersecting vertically extending plane 7065 and vertically extending plane 7067 as indicated in FIG. 2G. Each of the laser stack trenches generally at "A" and "B" can then be reopened for further processing, including by laser stack layer growing. At laser stack trench 510 of location C, contact layer 505 can be etched to expose a top surface of aluminum tuning layer 513A. Contact layer 505 and contact layer 506 can be in situ doped during a deposition stage specific for the formation of the layer. According to one embodiment, contact layer 505 and/or contact layer 506 at one or more of the locations A B and C can be formed by way of doping of a previously deposited layer. At laser stack 510 of location C, for example, contact layer 505 can be formed by ion implantation of layer 513A.

Figure 3:
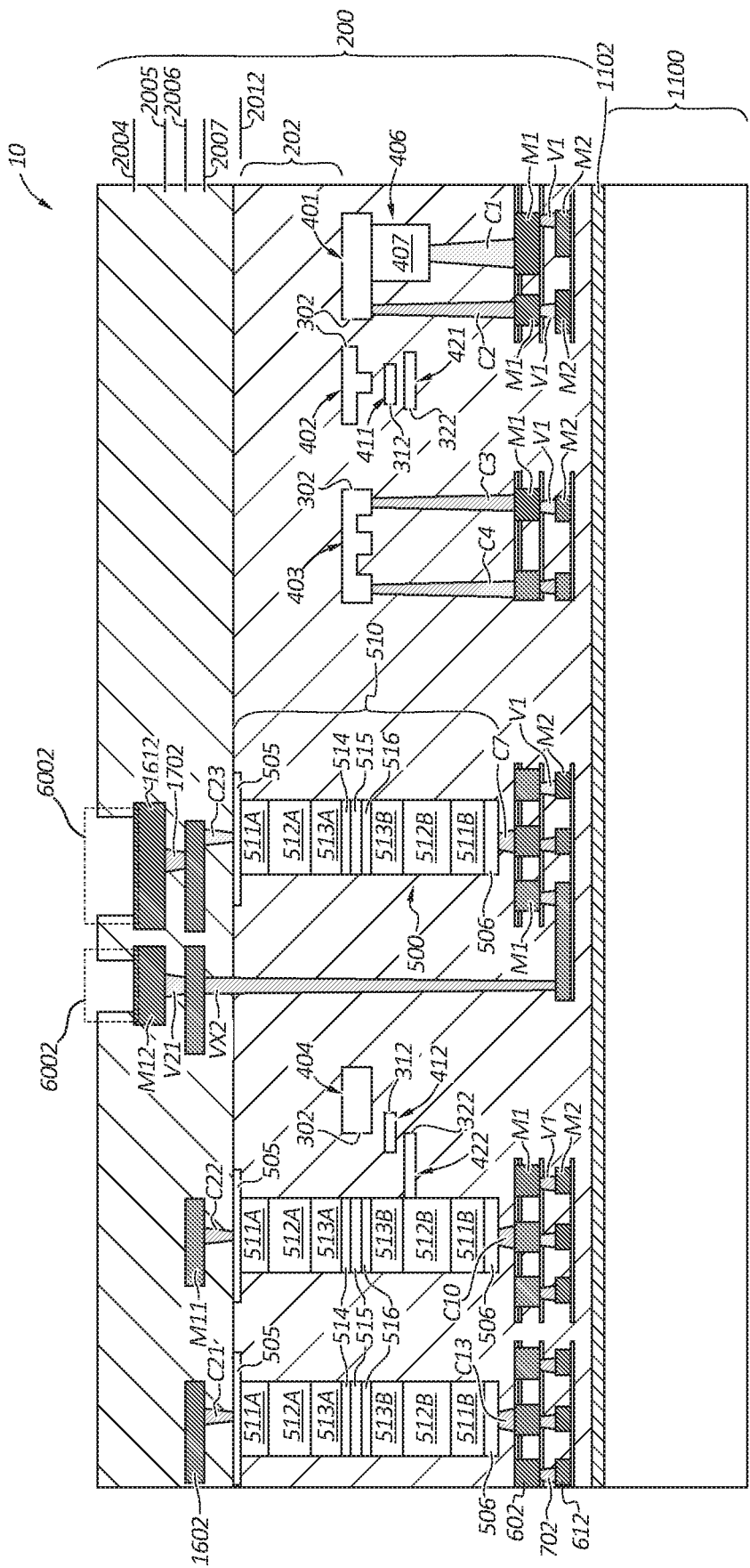
FIG. 3 is a cutaway side view of an optoelectronics system according to one embodiment.

FIG. 3 is a cutaway side view of photonics structure 10 having bottom contacts alternatively formed reactive to photonics structure 10 depicted in FIG. 1. An alternative process for the formation of bottom contacts for laser sources 500 is illustrated with respect to the fabrication stage use of FIGS. 4A and 4B.

Figure 4A:
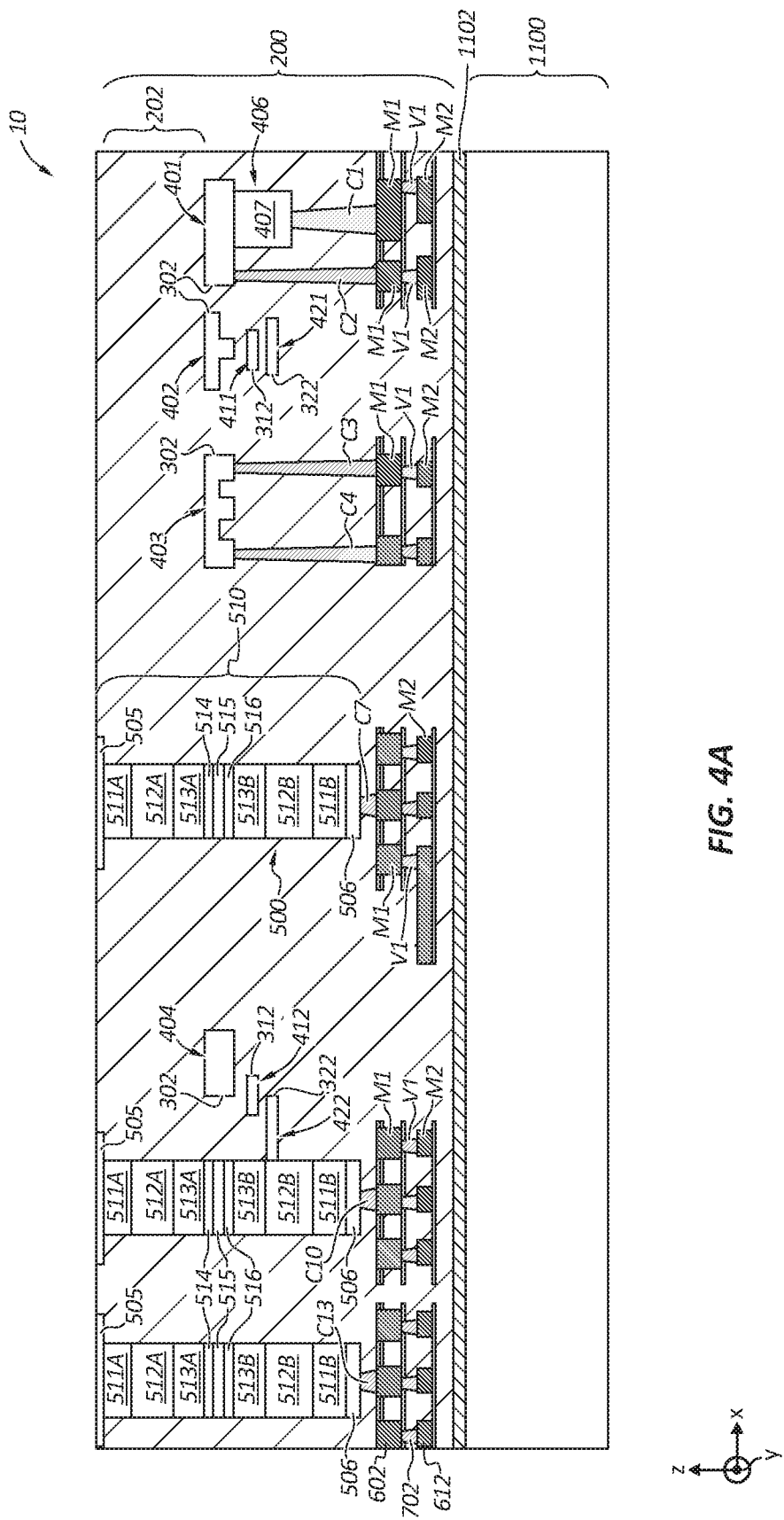
FIGS. 4A-4B are fabrication stage views illustrating a method for fabrication of the optoelectronics system according to FIG. 3.

Referring to FIG. 4A, the fabricating of structures within photonics dielectric stack 200 is performed in the manner of FIG. 2H except that the stages for the formation of laser source bottom contacts C5, C6, C8, C9, C11 and C12 are avoided and not performed and hence in the intermediary stage view depicted in FIG. 4A photonics structure 10 is absent of bottom contacts C5, C6, C8, C9, C11. Referring to the intermediary fabrication stage view of FIG. 4A, a handle wafer 1100 can be attached to a top side of photonics dielectric stack 200 with use of adhesive layer 1102. Handle wafer 1100 as shown in FIG. 4A, can be held by a wafer handler to facilitate backside processing of photonics structure 10.

With photonics structure 10 as shown in FIG. 4A placed in a wafer handler to facilitate backside processing, substrate 100, e.g., in a state substantially as depicted in FIG. 2H can be removed. With the removal of substrate 100 (FIG. 2H), laser stack buffer structures 502 can also be removed. For removal of substrate 100 and buffer structures 502, grinding process can be performed for the majority of the material removal with the last threshold percentage, e.g., 10% or less of material being removed with use of a reactive ion etching (RIE) process.

Figure 4B:
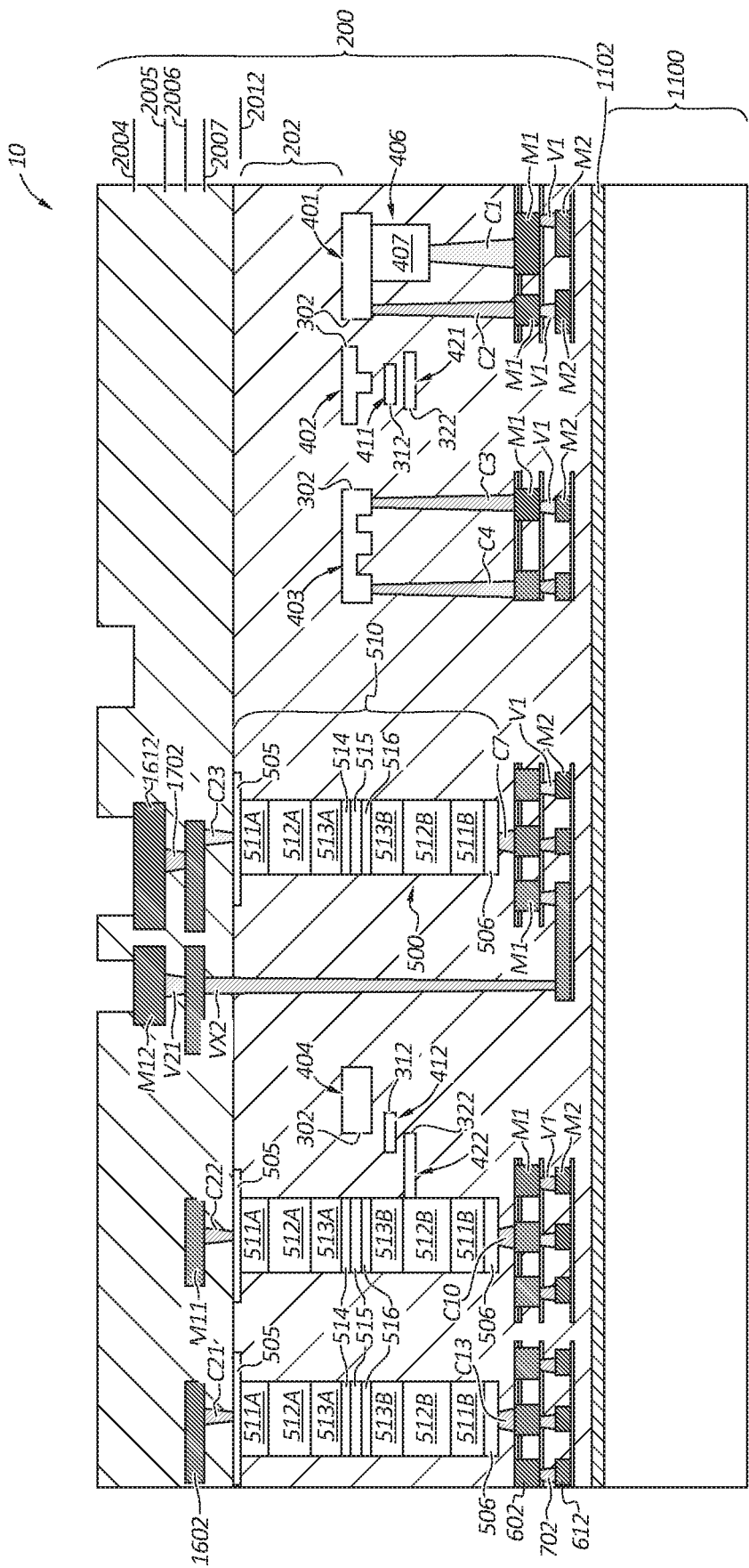

FIG. 4B illustrates photonics structure 10 in an intermediary stage of fabrication as shown in FIG. 4B after further fabrication to fabricate through via VX2, to extend photonics dielectric stack 200 and to fabricate additional structures within the extended photonics dielectric stack 200. After removal of material of substrate 100 to elevation 2012 to reveal contact layer 505 of laser stacks 510, dielectric material can be deposited and then subject to CMP to define a horizontally extending planar surface at elevation 2007. Trenches can then be formed for the fabrication of through via VX2 and bottom contacts C21, C22 and C23 of respective laser stacks 510. Conductive material can then be deposited in the respective trenches to define through via VX2, bottom contacts C21, C22 and C23 of respective laser stacks 510.

Dielectric material can be deposited and can be subject to CMP to define a horizontally extending planar surface at elevation 2006. Metallization trenches can then be formed. Metallization layer 1602 can be deposited in the metallization trenches and can be subject to CMP to define metallization formations M11 and to define a top surface of photonics structure 10 at elevation 2006. Dielectric depositing and CMP can then be performed to define a horizontally extending planar surface at elevation 2005. With photonics structure 10 in a stage having a top elevation at elevation 2005 vias trenches to define vias V21 can be etched and conductive material forming vias layer 1702 can be deposited in the vias trenches to define vias V21.

Dielectric material can be deposited at elevation 2005 and then subject to CMP to define a horizontally extending planar surface at elevation 2004. Metallization trenches can then be formed and metallization layer 1612 can be deposited in the metallization trenches to define metallization formations M12.

Dielectric material can be deposited at elevation 2005 and then subject to CMP to define a horizontally extending planar surface at elevation 2004. Trenches can be formed as shown to expose metallization formations. Terminations 6002 can then be fabricated. A termination 6002 can include, e.g., one or more of (a) an opening formed in photonics dielectric stack 200 opening to metallization layer 612; (b) a pad formed on metallization layer 612 and an opening to the pad; (c) an under bump metallization (UBM) layer formed on the metallization layer 612 with an opening formed in photonics dielectric stack 200 to the UBM; (d) a UBM formed on metallization layer 612 and a solder bump formed on the UBM externally protruding from photonics dielectric stack 200.

Fabricating according to the stage views depicted in FIGS. 4A and 4B culminating in the photonics structure 10 of FIG. 3 having terminations 6002 provided by backside terminations can reduce the height requirements of contacts connecting to contact layer 505. Tolerances and costs associated with the fabrication of such contacts accordingly can be reduced, and performance speed can be increased. Fabricating according to the stage views of FIGS. 2A-2I culminating in in the photonics structure 10 of FIG. 1 having terminations 6002 provided by frontside terminations can avoid additional processing stages e.g. for removal of material of substrate 100.

In the views of FIGS. 1-2I, laser stack 510 is depicted as having a certain bottom elevation. Referring to FIG. 2F, laser stacks 510 are depicted as having a bottom elevation at elevation 2002 within an elevation of substrate 100, which is the bottom elevation of buffer material formation 502.

Embodiments herein recognize that laser stacks 510 can be fabricated to have different bottom elevations and that different elevations can be yielded by the selection of such different bottom elevations. Embodiments herein recognize that a bottom elevation of laser stack 510 can be selected for optimization of light coupling according to a targeted light coupling scheme. According to some embodiments, a bottom elevation of laser stack 510 can be selected based on a selected coupling method for coupling light from active region 515 of laser stack 510 into one or more waveguide.

FIGS. 5A-5D depict differentiated coupling schemes coupling methods and structures for coupling light from active region 515 of laser stack 510 into a waveguide and also illustrate differentiated fabrication schemes wherein a bottom elevation of laser stack 510 can be selected in dependence on a selected coupling scheme for coupling light from active region 515 of laser stack 510 into one or more waveguide.

Figure 5A:
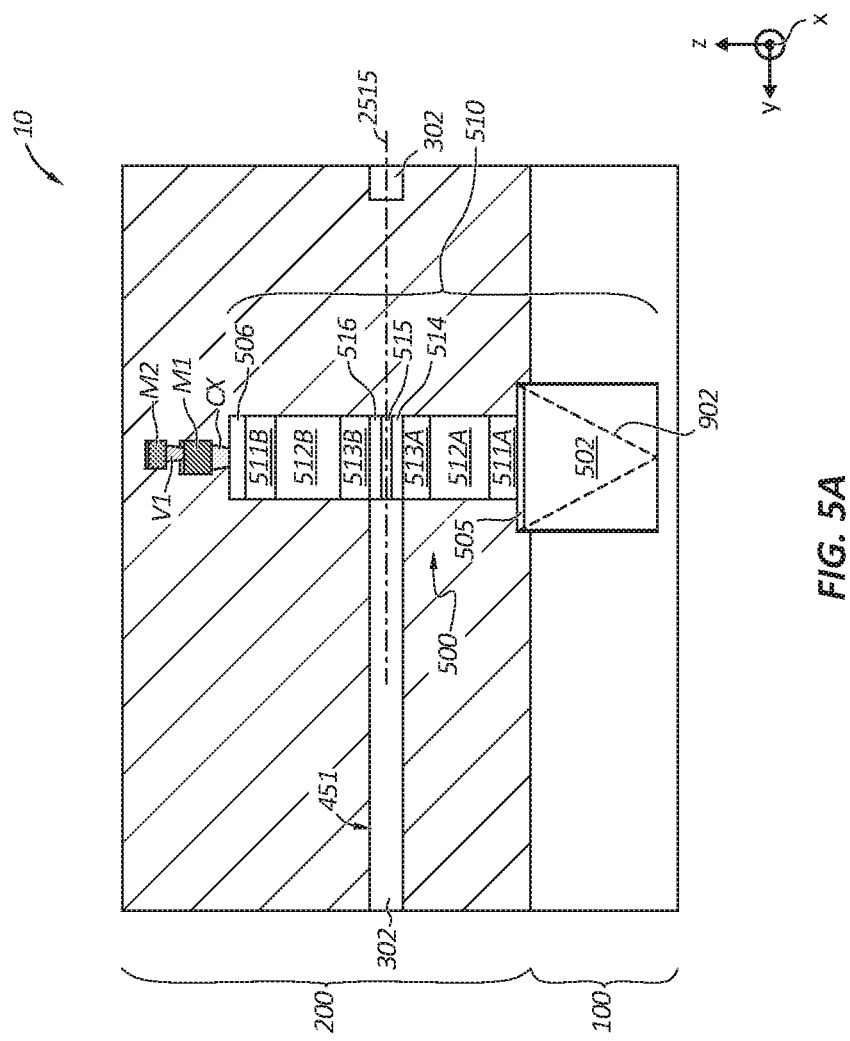
FIGS. 5A-5D are fabrication stage views in a Z-Y plane illustrating photonics structures fabricated for coupling light from an active region of a laser stack into one or more waveguide.

For coupling light from active region 515 into a waveguide, photonics structure 10 can be fabricated so that horizontally extending longitudinal axis of a waveguide can be aligned and coincident with a horizontally extending longitudinal axis of active region 515. FIG. 5A depicts laser source 500 as shown in FIG. 1, taken along the Z-Y plane rather than the ZX plane, as shown in FIG. 1 (FIG. 5A illustrates a view, extending into and out of the paper, as shown in FIG. 1).

Referring to FIG. 5A, photonics structure 10 can be fabricated and accordingly configured so that active region 515 and waveguide 451 are arranged so that horizontally extending longitudinal axis of active region 515 aligns with and coincides with a horizontally extending longitudinal axis of waveguide 451. The horizontally extending longitudinal axes of active region 515 and waveguide 451 can be coincident with axis 2515 as shown. Waveguide 451 can be fabricated by patterning of layer 302, which is silicon layer 302 as depicted in FIG. 1, which is the silicon layer of pre-fabricated silicon on insulator (SOI) wafer. FIG. 5A depicts direct coupling of active region 515 into waveguide 451 formed to silicon, wherein the silicon depicted is the silicon layer of an originally fabricated SOI wafer.

Figure 5B:
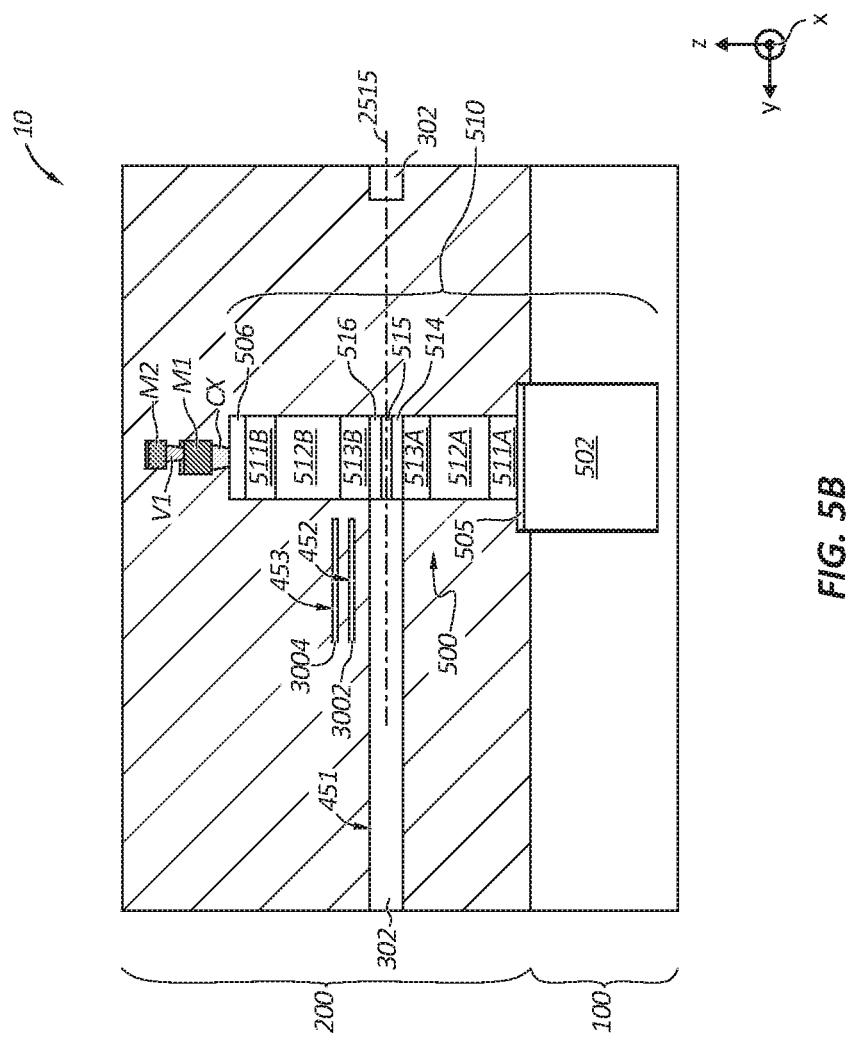

FIG. 5B depicts an alternative scheme for coupling light from active region 515 of laser stack 510 into waveguide 451. In the coupling scheme depicted in FIG. 5B, waveguide 452 fabricated from nitride layer 3002 and waveguide 453 fabricated from nitride layer 3004 can be fabricated to be disposed in proximity with waveguide 451, fabricated from layer. Waveguide 452 and waveguide 453 can be nitride e.g. SiN silicon nitride waveguides patterned in the manner described with reference to waveguide 411 and waveguide 421 set forth in reference to FIG. 1 and FIGS. 2A-2D.

Waveguide 452 and waveguide 453 can be sized, shaped, and located, and perform an evanescent coupling function wherein light propagating through waveguide 451 about axis 2515 can evanescently couple onto waveguide 452 and/or waveguide 453 and can recouple by way of evanescent in coupling back into waveguide 451 to improve overall light transmission through waveguide 451.

Figure 5C:
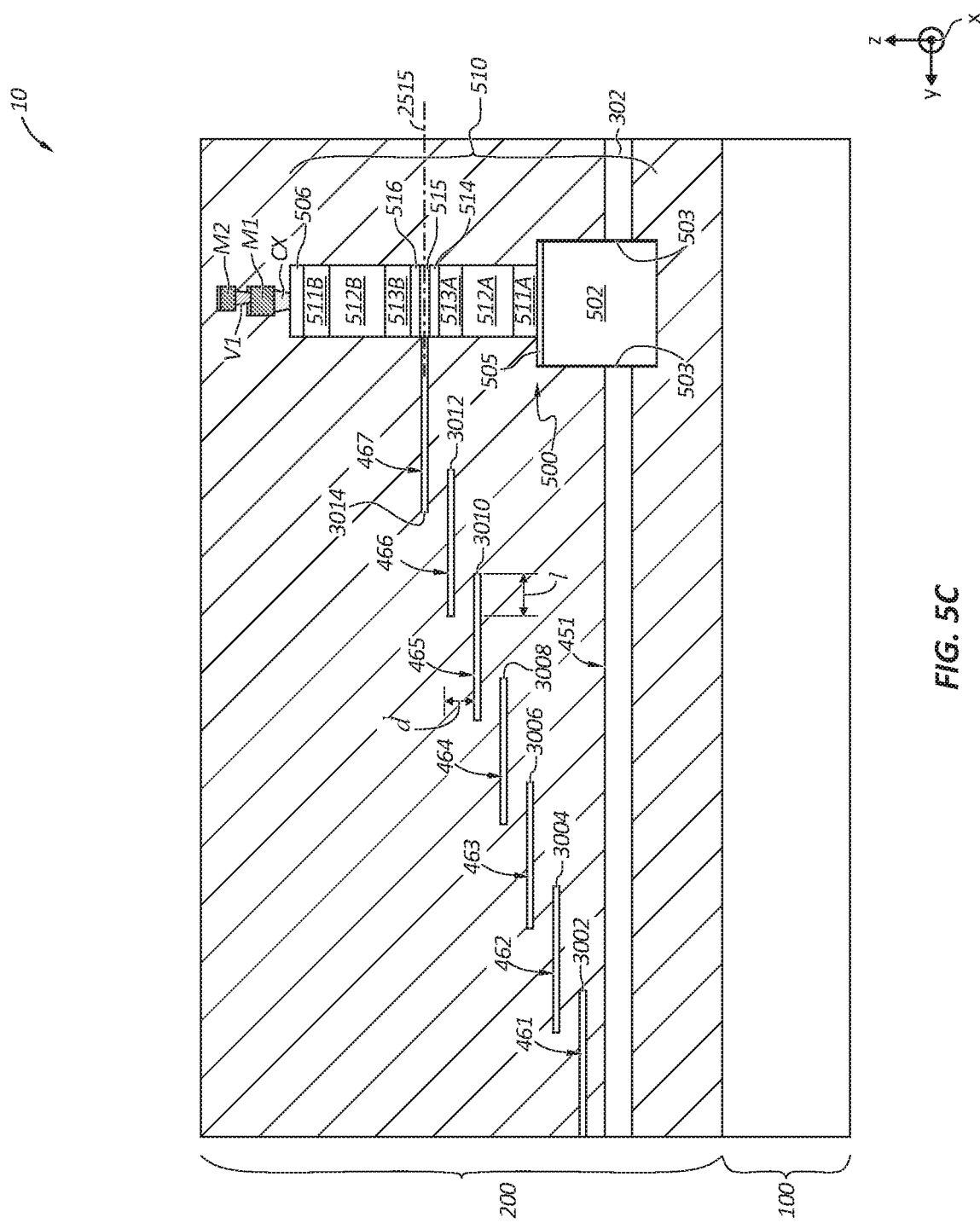

FIG. 5C depicts an alternative coupling scheme for coupling light from active region 515 a laser stack 510 to one or more waveguide. In photonics structure 10 as depicted in FIG. 5C a horizontally extending longitudinal axis of active region 515 and a horizontally extending longitudinal axis of waveguide 467 can be aligned and can be coincident with each other on axis 2515. Waveguide 467 can be a waveguide patterned from layer 3014 formed of nitride.

Photonics structure 10, as depicted in FIG. 5C can include waveguide 461 patterned from layer 3002 waveguide 462 patterned from layer 3004 waveguide 463 patterned from layer 3006 waveguide 464 patterned from layer 3008 waveguide 465 patterned from layer 3010, waveguide 466 patterned from 3012, and waveguide 467 patterned from layer 3014. Layers 3002, 3004, 3006, 3008, 3010, 3012,3014 can be nitride layers so that the fabricated respective waveguides 461-467 are nitride waveguides. Waveguides 461-467 as depicted in FIG. 5C can be fabricated to be in a step-wise pattern to encourage evanescent coupling between the waveguides 461-467, namely light propagating through waveguide 467 can evanescently couple into waveguide 466 which light can evanescently couple into waveguide 465 which light can evanescently couple into waveguide 464 which can evanescently couple into waveguide 463 which light can evanescently couple into waveguide 462 which light can evanescently couple into waveguide 461 which light can evanescently couple into waveguide 451 patterned from layer 3002 formed of silicon. Photonics structure 10 is depicted in FIG. 5C illustrates a coupling scheme wherein light emitted from active region 515 of laser stack 510 can directly couple into a waveguide 467 formed of nitride and thereafter can evanescently couple through a series of waveguides eventually into waveguide 451 formed of silicon, which waveguide 451 can be patterned from layer 302 formed of silicon which can be a silicon layer of a prefabricated silicon on insulator (SOI) wafer. For facilitation of the coupling scheme depicted in FIG. 5C of bottom elevation of laser stack 510 can be selected and fabricated to have a higher elevation than laser stack 510 depicted in FIG. 1.

Waveguides 4067-461 as depicted in FIG. 5C can be sized, shaped and located to facilitate evanescent coupling of light from waveguide 467 downwardly through waveguides 466-461 and eventually into waveguide 451 formed of silicon.

Figure 5D:
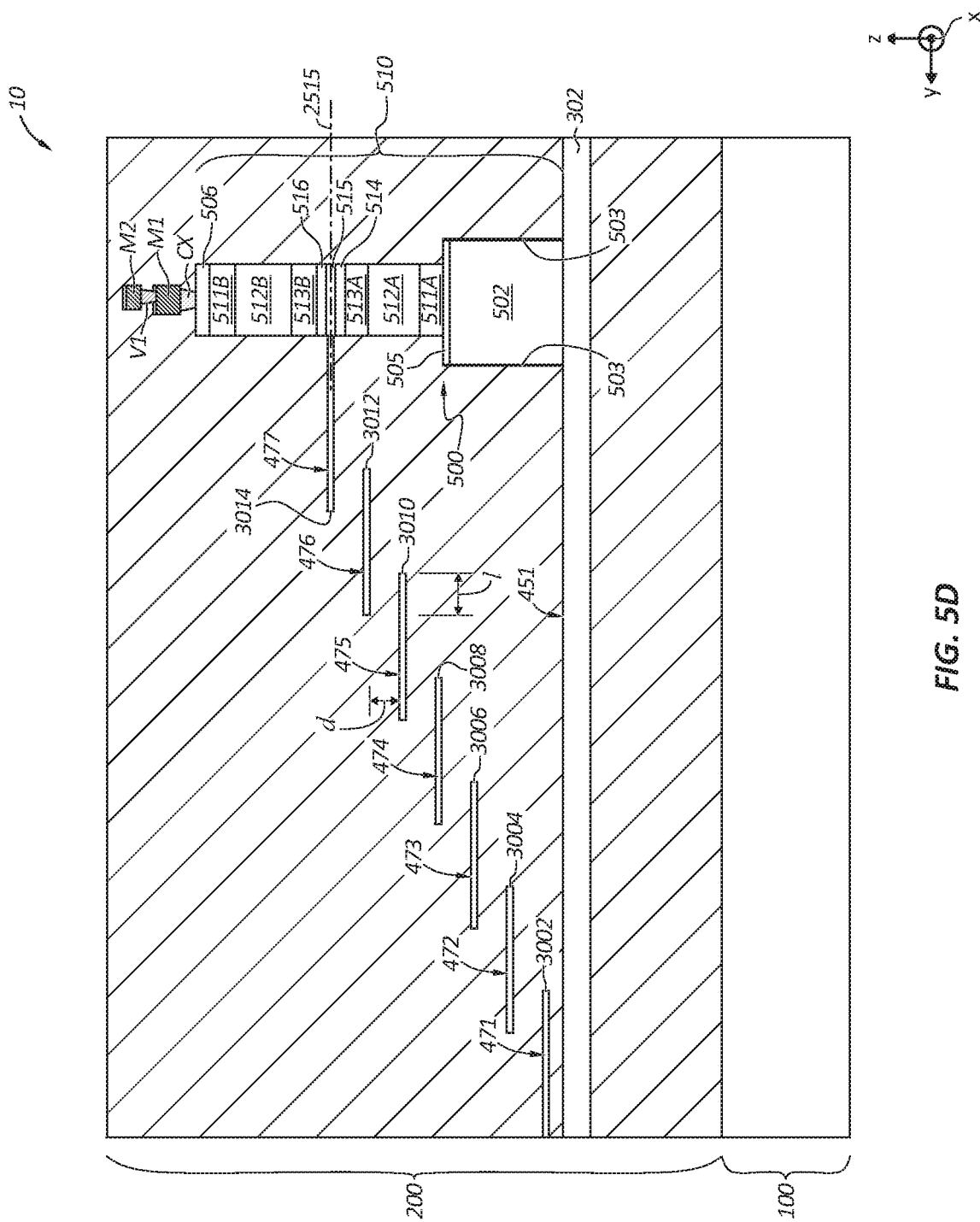

In the coupling scheme depicted in FIG. 5D a bottom elevation of laser stack 510 is at a higher elevation than as depicted in the arrangement of FIG. 5C.

Photonics structure 10 as shown in FIG. 5D can be fabricated so that buffer material formation 502 is a epitaxially grown on a top surface of layer 302, which can be the silicon layer of a pre-fabricated silicon on insulator (SOI) wafer. Layer 302 as shown throughout the views, according to one embodiment, can feature advantages associated with being prefabricated with use of high temperature treatments e.g. above 500 degrees C., in some cases above 700 degrees C. and in some cases above 1000 degrees C. Layer 302, which can be prefabricated as part of an SOI wafer, can be subject to annealing processes for annihilation of defects with use of a thermal budget that can be limited after patterning of layer 302 for fabrication of devices.

The coupling scheme depicted in FIG. 5D can operate in the manner of the coupling scheme as described in connection with photonic structure 10 as shown in FIG. 5C. Horizontally extending longitudinal axes of active region 515 and horizontally extending longitudinal axis of waveguide 477 can be aligned and can be coincident on axis 2515. Light emitted from active region 515 can be directly coupled into waveguide 477 formed of nitride. Light coupling into waveguide 477 can evanescently couple successively though the series of waveguides 476, and 475, 474, 473, 472, and 471 and eventually into waveguide 451, which can be patterned from layer 302 which can be the silicon layer of a prefabricated SOI wafer. Waveguides 477-471 as depicted in FIG. 5D can be sized, shaped, and located in relative positions to facilitate evanescent coupling downward through the series of waveguides 477 through waveguide 471, and ultimately into waveguide 451, patterned from layer 302 formed of silicon (Si).

Waveguide such as waveguide 451 (FIGS. 5A-5B), waveguide 467 (FIG. 5C) and waveguide 477 (FIG. 5D) that are coupled to an active region 515 of a laser stack can be edge coupled to active region 515. For promotion of light coupling between active region 515 and a waveguide edge coupled to the active region, the active region and the waveguide can be configured to include compatible mode profiles, wherein the respective mode profiles define respective spatial area distributions of a traveling light signal. Mode profiles can be tuned using e.g. indices of refraction e.g. of the active region 515, the edge coupled waveguide, the respective geometries of active region 515 and the edge coupled waveguide and the index of refraction of dielectric material surrounding the edge coupled waveguide and laser stack 510. With the design parameters tuned for configuration of compatible mode profiles, light signal losses including by way of reflections returned to active region (recycling losses) can be reduced. According to some embodiments, for reduction of light losses, light entry ends of edge coupled waveguides that are edge coupled to active region 515 can be tapered.

Figure 5E:
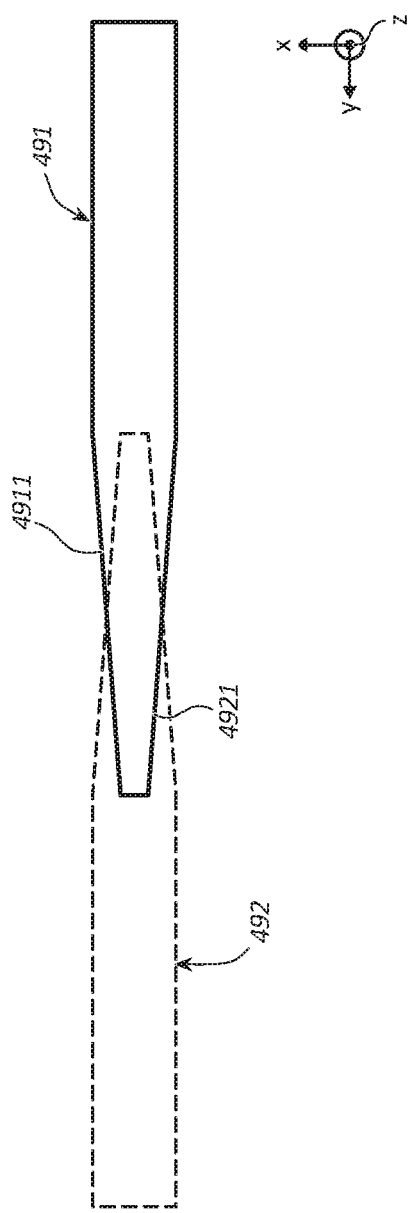
FIG. 5E is a top view of first and second evanescently coupled waveguides in a Y-X plane.

For optimizing evanescent coupling between waveguides, size, shape, and location of evanescently coupled waveguides can be coordinated. For tuning of evanescent coupling, parameters that can be controlled can include: (a) Z direction spacing distance, d, as depicted in FIGS. 5C-5D, (b) overlap length, l, as depicted in FIGS. 5C-5D, and (c) taper geometry. Tapered evanescently coupled waveguides are depicted in FIG. 5E. To promote evanescent coupling between first and second waveguides, waveguides can have overlapping tapered ends.

As shown in FIG. 5E depicting a top Y-X plane view of first and second waveguides, first waveguide 491 can have a tapered end 4911 coordinated to a tapered end 4921 of second waveguide 492, wherein second waveguide has an elevation lower than that of waveguide 491 (and therefore is depicted in dashed form). First waveguide 491 and second waveguide 492 can represent any combination of any combination of upper and lower evanescently coupling waveguides as depicted in FIGS. 5A-5D. Characteristics of evanescent coupling can be in dependence on various additional parameters e.g. the index of refraction of first waveguide 491, the index of refraction of second waveguide 492, the index of refraction of surrounding dielectric material of photonics dielectric stack 200 surrounding the waveguides, and the wavelength of traveling light.

In any of the described embodiments of a laser stack 510, a square groove trench for accommodation of the deposition of material defining buffer material formation 502 can be substituted by a V groove trench indicated by the dashed line 902 depicted in FIG. 5A. The presence of a V groove trench can according to some embodiments reduce the formation of defects during the deposition process.

The terminology used herein is for the purpose of describing particular embodiments only and is not intended to be limiting. The term "on" in one embodiment can refer to a relationship where an element is "directly on" a specified element without intervening elements between the element and the specified element. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Forms of the term "defined by" encompass relationships where an element is partially defined by as well relationships where an element is entirely defined by. Numerical identifiers herein, e.g. "first" and "second" are arbitrary terms to designate different elements without designating an ordering of elements. Furthermore, a system method or apparatus that is configured in a certain way is configured in at least that way, but may also be configured in ways that are not listed. Furthermore, a system method or apparatus set forth as having a certain number of elements can be practiced with less than or greater than the certain number of elements.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A photonics structure comprising:
   a substrate;
   a dielectric stack disposed on the substrate;
   one or more photonics device integrated in the dielectric stack; and
   a laser light source having a laser stack including a plurality of structures arranged in a stack, wherein structures of the plurality of structures are integrated in the dielectric stack, wherein the laser stack includes an active region configured to emit light in response to the application of electrical energy to the laser stack, wherein the laser light source includes a buffer material formation having a bottom elevation below a top elevation of the substrate.

2. The photonics structure of claim 1, wherein the laser light source includes a buffer material formation, a cladding layer, an aluminum tuning layer and an active region.

3. The photonics structure of claim 1, wherein the dielectric stack is defined by an insulator layer of a silicon on insulator (SOI) wafer, and wherein a photonics device of the one or more photonics device is defined by a silicon layer of the SOI wafer.

4. The photonics structure of claim 1, wherein the one or more photonics device integrally formed within the dielectric stack includes a waveguide, wherein the active region has an elevation in common with waveguide, and wherein the active region is configured to emit light into the waveguide.

5. The photonics structure of claim 1, wherein the one or more photonics device integrally formed within the dielectric stack includes a monocrystalline silicon waveguide having a horizontally extending longitudinal axis, wherein the horizontally extending longitudinal axis of the waveguide is aligned with a horizontally extending longitudinal axis of the active region, and wherein the active region is configured to emit light into the monocrystalline silicon waveguide.

6. The photonics structure of claim 1, wherein the one or more photonics device integrally formed within the dielectric stack includes a nitride waveguide having a horizontally extending longitudinal axis, wherein the horizontally extending longitudinal axis of the waveguide is aligned with a horizontally extending longitudinal axis of the active region, and wherein the active region is configured to emit light into the nitride waveguide.

7. The photonics structure of claim 1, wherein the one or more photonics device integrally formed within the dielectric stack includes a nitride waveguide having a horizontally extending longitudinal axis, wherein the horizontally extending longitudinal axis of the waveguide is aligned with a horizontally extending longitudinal axis of the active region, and wherein the active region is configured to emit light into the nitride waveguide, wherein the dielectric stack is defined by an insulator layer of a silicon on insulator (SOI) wafer, and wherein a photonics device of the one or more photonics device is monocrystalline waveguide defined by a silicon layer of the SOI wafer, wherein the photonics structure includes a plurality of waveguides arranged in an overlapping stepwise pattern configured to evanescently couple light emitted from the active region into the monocrystalline waveguide defined by a silicon layer of the SOI wafer.

8. The photonics structure of claim 1, wherein the laser light source includes a buffer material formation, a contact layer, an aluminum tuning layer and an active layer.

9. The photonics structure of claim 1, wherein the one or more photonics device disposed within the dielectric stack includes a monocrystalline silicon waveguide having a horizontally extending longitudinal axis, wherein the horizontally extending longitudinal axis of the waveguide coincides with a horizontally extending longitudinal axis of the active region, and wherein the active region is configured to emit light into the monocrystalline silicon waveguide.

10. The photonics structure of claim 1, wherein the substrate is a substrate of a silicon on insulator (SOI) wafer having a silicon layer formed on an insulator which is formed on the substrate, wherein the one or more photonics device includes a waveguide defined by the silicon layer, the waveguide being being aligned with the active region.

11. The photonics structure of claim 1, wherein the one or more photonics device includes each of a photodetector integrated in the dielectric stack, a modulator integrated in the dielectric stack and, and a waveguide integrated in the dielectric stack.

12. The photonics structure of claim 1, wherein the photonics structure includes a second laser light source having a second laser stack, wherein the laser stack and the second laser stack each include a bottom contact layer interfaced to a contact, wherein the bottom contact layer of the second laser stack is at a higher elevation than a bottom contact layer of the laser stack.

13. The photonics structure of claim 1, wherein the dielectric stack is defined by an insulator layer of an SOI wafer, and wherein the laser stack extends entirely through elevations of the insulator layer.

14. A method comprising:
patterning a waveguide in a silicon layer of a silicon on insulator (SOI) wafer of a photonics structure having a dielectric stack defined by an insulator of the SOI wafer;
forming in the photonics structure a trench extending through dielectric layers of the dielectric stack; and
epitaxially growing a laser stack within the trench, the laser stack including a plurality of structures arranged in a stack, wherein structures of the plurality of structures are disposed within the dielectric stack and include an active region configured to emit light in response to the application of electrical energy to the laser stack, wherein the forming in the photonics structure a trench extending through dielectric layers of the dielectric stack includes forming in the photonics structure a trench extending through dielectric layers of the dielectric stack so that the trench has a bottom elevation lower than a top elevation of a substrate of the SOI wafer.

15. The method of claim 14, wherein the active region is aligned with the waveguide.

16. The method of claim 14, wherein the waveguide is horizontally extending and disposed at an elevation in common with an elevation of the active region which is aligned with the waveguide and wherein the active region emits light horizontally so that light emitted by the active region is coupled into the waveguide.

17. The method of claim 14, wherein the patterning the waveguide in the silicon layer includes using a first process temperature range, and wherein the epitaxially growing includes epitaxially growing a buffer material formation defining the laser stack using a second process temperature range, wherein a highest temperature of the second process temperature range is lower than a highest temperature of the first process temperature range.

18. The method of claim 14, wherein the epitaxially growing the laser stack includes epitaxially growing a buffer material formation, epitaxially growing a contact layer on the buffer material formation, epitaxially growing a first aluminum tuning layer the buffer material formation, epitaxially growing a second cladding layer on the first aluminum tuning layer, epitaxially growing a second aluminum tuning layer on the first cladding layer, epitaxially growing a spacer layer on the second aluminum tuning layer and epitaxially growing the active region on the spacer layer.

19. The method of claim 14, wherein the active region comprises quantum dots.

20. The method of claim 14, wherein the epitaxially growing a laser stack within the trench includes epitaxially growing a buffer material formation on a silicon surface defined by the substrate, wherein the method includes removing the substrate and material of the buffer material formation to reveal a bottom side surface of the dielectric stack, and fabricating an extended dielectric stack region on the bottom side surface of the dielectric stack, wherein the method includes fabricating in the extended dielectric stack region an integrated electrical contact that contacts a contact layer of the laser stack, and fabricating a termination in electrical communication with the electrical contact.

21. The photonics structure of claim 1, wherein the laser stack includes a first tuning layer for confining light within the activation region at an elevation lower than the active region, and a second tuning layer for confining light within the activation region at an elevation higher than the active region.

22. The photonics structure of claim 1, wherein the laser stack includes a patterned layer pattern integrated in the dielectric stack for selection of a wavelength at which the active region operates.

23. A photonics structure comprising:
a substrate;
a dielectric stack disposed on the substrate;
one or more photonics device integrated in the dielectric stack; and
a laser light source having a laser stack including a plurality of structures arranged in a stack, wherein structures of the plurality of structures are integrated in the dielectric stack, wherein the laser stack includes an active region configured to emit light in response to the application of electrical energy to the laser stack, wherein the dielectric stack is defined by an insulator layer of a silicon on insulator (SOI) wafer, and wherein a photonics device of the one or more photonics device is monocrystalline waveguide defined by a silicon layer of the SOI wafer, wherein the photonics structure includes a plurality of waveguides arranged in an overlapping stepwise pattern configured to evanescently couple light emitted from the active region into the monocrystalline waveguide defined by a silicon layer of the SOI wafer.

24. A photonics structure comprising:
a substrate;
a dielectric stack disposed on the substrate;
one or more photonics device integrated in the dielectric stack; and
a laser light source having a laser stack including a plurality of structures arranged in a stack, wherein structures of the plurality of structures are integrated in the dielectric stack, wherein the laser stack includes an active region configured to emit light in response to the application of electrical energy to the laser stack, wherein the photonics structure includes a second laser light source having a second laser stack, wherein the laser stack and the second laser stack each include a bottom contact layer interfaced to a contact, wherein a bottom contact layer of second laser stack is at a higher elevation than a bottom contact layer of the laser stack.

25. A photonics structure comprising:
a substrate;
a dielectric stack disposed on the substrate;
one or more photonics device integrated in the dielectric stack; and
a laser light source having a laser stack including a plurality of structures arranged in a stack, wherein structures of the plurality of structures are integrated in the dielectric stack, wherein the laser stack includes an active region configured to emit light in response to the application of electrical energy to the laser stack, wherein the dielectric stack is defined by an insulator layer of an SOI wafer, and wherein the laser stack extends entirely through elevations of the insulator layer.

26. A photonics structure comprising:
a substrate;
a dielectric stack disposed on the substrate;
one or more photonics device integrated in the dielectric stack; and
a laser light source having a laser stack including a plurality of structures arranged in a stack, wherein structures of the plurality of structures are integrated in the dielectric stack, wherein the laser stack includes an active region configured to emit light in response to the application of electrical energy to the laser stack, wherein the dielectric stack is defined by an insulator layer of an SOI wafer, wherein a bottom elevation of the laser stack is defined by a bottom elevation of a buffer material formation, the buffer material formation having a bottom elevation within an elevation of the insulator layer.

27. The photonics structure of claim 25, wherein the laser light source include a buffer material formation having a bottom elevation below a top elevation of the substrate.

28. The photonics structure of claim 24, wherein the bottom contact layer of the second laser stack is epitaxially grown on an aluminum tuning layer of the second laser stack, wherein the bottom contact layer of the laser stack is epitaxially grown on a buffer material formation of the laser light source.

* * * * *